United States Patent
Morrow

(10) Patent No.: US 11,635,307 B1
(45) Date of Patent: Apr. 25, 2023

(54) HALL EFFECT TRANSDUCER ASSEMBLIES AND METHODS

(71) Applicant: STRESS ENGINEERING SERVICES, INC., Batavia, OH (US)

(72) Inventor: Daniel L. Morrow, Batavia, OH (US)

(73) Assignee: STRESS ENGINEERING SERVICES, INC., Mason, OH (US)

( * ) Notice: Subject to any disclaimer, the term of this patent is extended or adjusted under 35 U.S.C. 154(b) by 0 days.

(21) Appl. No.: 17/902,083

(22) Filed: Sep. 2, 2022

Related U.S. Application Data

(60) Provisional application No. 63/334,736, filed on Apr. 26, 2022.

(51) Int. Cl.
*G01D 5/14* (2006.01)
*G01D 11/24* (2006.01)

(52) U.S. Cl.
CPC ........... *G01D 5/145* (2013.01); *G01D 11/245* (2013.01)

(58) Field of Classification Search
CPC .... G01D 5/145; G01D 11/245; G01R 33/072; G01R 33/0047
See application file for complete search history.

(56) References Cited

U.S. PATENT DOCUMENTS

| | | | |
|---|---|---|---|
| 5,740,881 A | 4/1998 | Lensak | |
| 5,853,065 A | 12/1998 | Hutson et al. | |
| 6,578,663 B2 | 6/2003 | Schmitt et al. | |
| 6,657,547 B2 | 12/2003 | Ching-Yao | |
| 6,966,403 B1 | 11/2005 | Chandra | |
| 8,669,859 B2 | 3/2014 | Wang | |
| 9,711,028 B1 | 7/2017 | Friedman | |
| 10,081,981 B2 | 9/2018 | Finegan | |
| 10,151,471 B2 | 12/2018 | Hulet et al. | |
| 10,378,278 B2 | 8/2019 | Tang | |
| 10,487,578 B2 | 11/2019 | Smith et al. | |
| 11,120,679 B2 | 9/2021 | Negre et al. | |
| 11,486,772 B1* | 11/2022 | Morrow | G01L 1/122 |
| 11,499,370 B2* | 11/2022 | Haynes | G08B 21/02 |
| 2005/0173189 A1 | 8/2005 | Berardi | |

(Continued)

FOREIGN PATENT DOCUMENTS

| | | |
|---|---|---|
| CN | 201756908 U | 3/2011 |
| CN | 203066837 U | 7/2013 |

(Continued)

*Primary Examiner* — Reena Aurora
(74) *Attorney, Agent, or Firm* — Ulmer & Berne LLP

(57) ABSTRACT

A transducer assembly includes an engagement plate, a mounting plate, a support structure, and first and second Hall effect sensor assemblies. The mounting plate defines an S-shaped cutout extending through the mounting plate to define first and second finger regions and a perimeter region. The first finger region includes a first distal end spaced from the perimeter region by a first gap defined by the S-shaped cutout. The second finger region includes a second distal end spaced from the perimeter region by a second gap defined by the S-shaped cutout. The support structure includes a base and first and second tabs. The base is sandwiched between the engagement plate and the mounting plate. The first and second tabs extend from the base and into the first and second gaps, respectively. The first and second Hall effect sensor assemblies are configured to detect movement of the first and second tabs, respectively.

24 Claims, 13 Drawing Sheets

(56) References Cited

U.S. PATENT DOCUMENTS

| | | |
|---|---|---|
| 2006/0032764 A1 | 2/2006 | Chandra |
| 2007/0080021 A1 | 4/2007 | Collins |
| 2014/0231170 A1 | 8/2014 | Frame et al. |
| 2015/0285476 A1 | 10/2015 | Bina et al. |
| 2016/0356086 A1 | 12/2016 | Saccoccio et al. |
| 2017/0303187 A1 | 10/2017 | Crouthamel et al. |
| 2018/0357879 A1 | 12/2018 | Negre et al. |
| 2020/0347674 A1 | 11/2020 | Haynes et al. |
| 2021/0366258 A1 | 11/2021 | Negre et al. |

FOREIGN PATENT DOCUMENTS

| | | |
|---|---|---|
| CN | 203978260 U | 12/2014 |
| CN | 204163605 U | 2/2015 |
| CN | 204716122 U | 10/2015 |
| CN | 104278944 B | 8/2017 |
| CN | 207073387 U | 3/2018 |
| DE | 10138020 A1 | 2/2002 |
| EP | 1775418 A2 | 4/2007 |
| EP | 1775418 A3 | 2/2009 |
| GB | 1389139 | 4/1975 |
| GB | 2470461 A | 11/2010 |
| JP | 6457460 B2 | 1/2019 |
| KR | 200420474 Y1 | 7/2006 |
| KR | 101571399 B1 | 11/2015 |
| WO | 200685878 A1 | 8/2006 |
| WO | 2006085878 A1 | 8/2006 |
| WO | 2011051885 A1 | 5/2011 |
| WO | 2016176301 A2 | 11/2016 |
| WO | 2016176301 A3 | 11/2016 |
| WO | 2017131589 A1 | 8/2017 |

\* cited by examiner

HALL EFFECT TRANSDUCER ASSEMBLIES AND METHODS

REFERENCE TO RELATED APPLICATION

This application claims priority of U.S. provisional patent application Ser. No. 63/334,736 filed Apr. 26, 2022, entitled "Load Cells, Ladder Foot Sensor Assemblies, Ladders, Systems, and Methods," and hereby incorporates this provisional patent application by reference herein in its entirety.

TECHNICAL FIELD

The transducer assemblies and methods described herein can facilitate measurement of forces within a load path.

BACKGROUND

Conventional apparatus and methods for measurement of loads within a load path can exhibit a form factor, size, operation, and/or other configurational aspect(s) that render them ineffective for implementation within certain applications.

SUMMARY

In accordance with one embodiment, a transducer assembly comprises an engagement plate, a mounting plate, a support structure, a first sensor assembly, and a second sensor assembly. The engagement plate comprises a first lower surface and a first upper surface. The first lower surface is opposite the first upper surface. The mounting plate comprises a second lower surface and a second upper surface. The second lower surface is opposite the second upper surface. The mounting plate comprises a perimeter region and an inner region. The perimeter region circumscribes the inner region. The mounting plate defines an S-shaped cutout extending through the mounting plate from the second lower surface to the second upper surface to define a first finger region of the inner region and a second finger region of the inner region. The first finger region extends from a first proximal end to a first distal end. The first proximal end is coupled with the perimeter region. The first distal end is spaced from the perimeter region by a first gap defined by the S-shaped cutout. The second finger region extends from a second proximal end to a second distal end. The second proximal end is coupled with the perimeter region. The second distal end is spaced from the perimeter region by a second gap defined by the S-shaped cutout. The perimeter region defines a first aperture adjacent to the first gap. The perimeter region defines a second aperture adjacent to the second gap. The support structure comprises a base, a first tab, and a second tab. The base extends longitudinally from a first end to a second end. The base comprises a third lower surface and a third upper surface. The third lower surface is opposite the third upper surface. The third upper surface is adjacent to portions of the second lower surface corresponding with each of the first finger region and the second finger region. The third lower surface is adjacent to the first upper surface. The first tab extends perpendicularly from the first end of the base and into the first gap. The first tab defines a first receptacle. The second tab extends perpendicularly from the second end of the base and into the second gap. The second tab defines a second receptacle. The first sensor assembly comprises a first magnet and a first Hall effect sensor in magnetic proximity to one another. One of the first magnet and the first Hall effect sensor is at least partially disposed and fixedly coupled within the first aperture. The other of the first magnet and the first Hall effect sensor is at least partially disposed and fixedly coupled within the first receptacle. The second sensor assembly comprises a second magnet and a second Hall effect sensor in magnetic proximity to one another. One of the second magnet and the second Hall effect sensor is at least partially disposed and fixedly coupled within the second aperture. The other of the second magnet and the second Hall effect sensor is at least partially disposed and fixedly coupled within the second receptacle.

In accordance with another embodiment, a transducer assembly comprises an engagement plate, a mounting plate, a support structure, a first Hall effect sensor assembly, and a second Hall effect sensor assembly. The mounting plate defines an S-shaped cutout extending through the mounting plate to define a first finger region, a second finger region and a perimeter region. The first finger region comprises a first distal end spaced from the perimeter region by a first gap defined by the S-shaped cutout. The second finger region comprises a second distal end spaced from the perimeter region by a second gap defined by the S-shaped cutout. The support structure comprises a base, a first tab, and a second tab. The base is sandwiched between the engagement plate and the mounting plate. The first tab extends from the base and into the first gap. The second tab extends from the base and into the second gap. The first Hall effect sensor assembly is configured to detect movement of the first tab. The second Hall effect sensor assembly is configured to detect movement of the second tab.

BRIEF DESCRIPTION OF THE DRAWINGS

It is believed that certain embodiments will be better understood from the following description taken in conjunction with the accompanying drawings in which.

DETAILED DESCRIPTION

Figure 1:
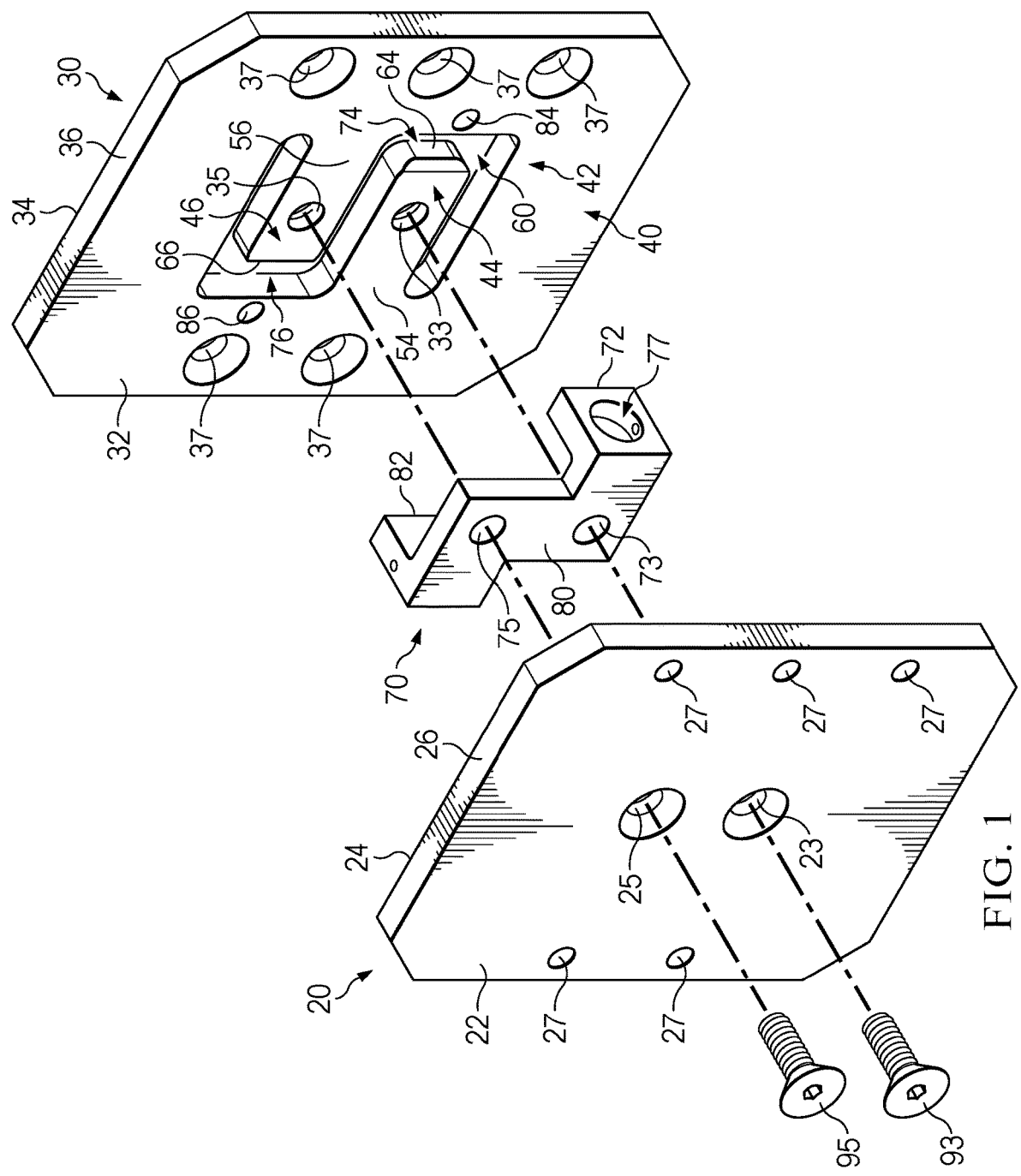
FIG. 1 is a partially exploded bottom perspective view depicting certain components of a transducer assembly in accordance with one embodiment.
Figure 4:
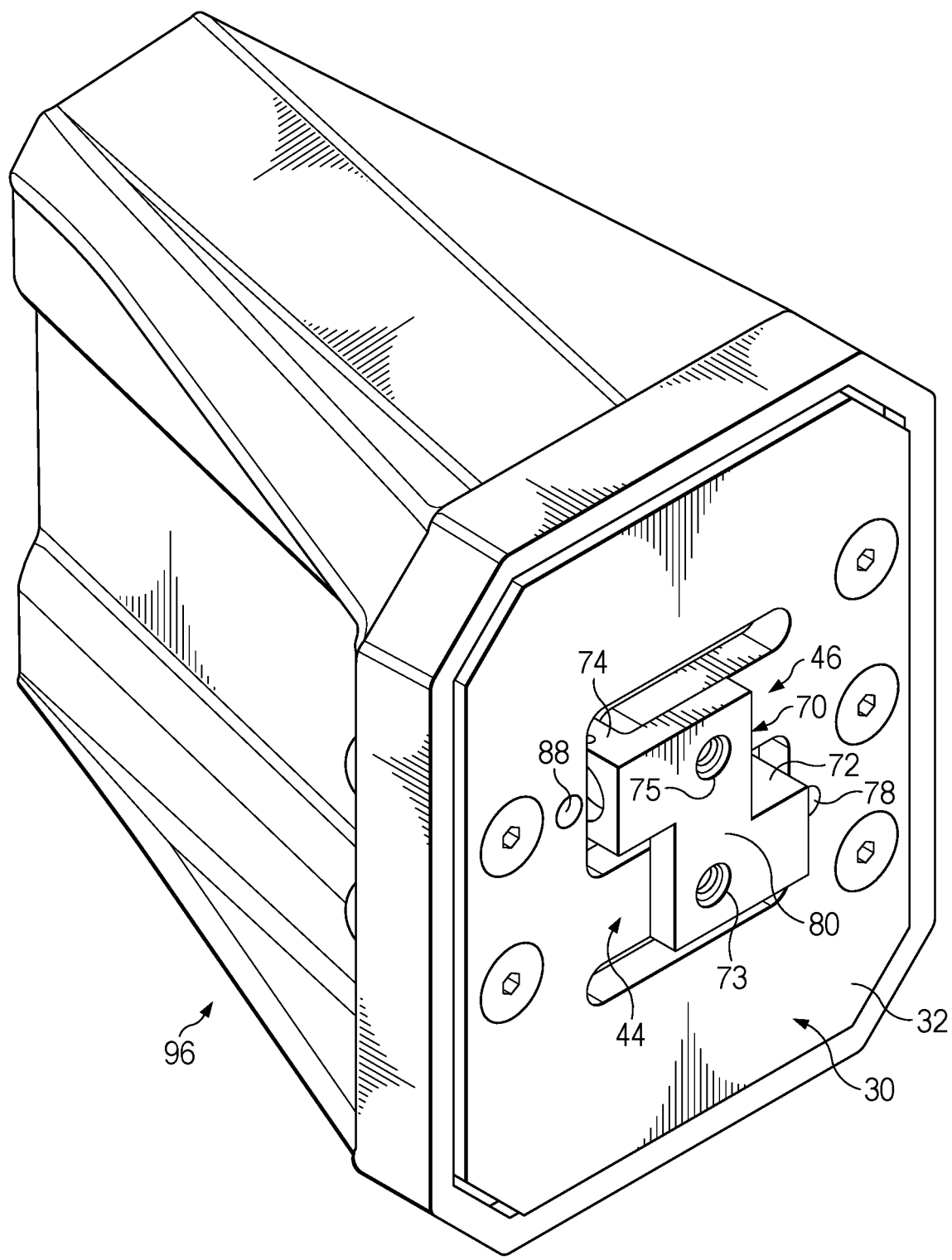
FIG. 4 is a bottom perspective view depicting the arrangement of FIG. 3, but with a support structure of FIG. 1 being additionally depicted.
Figure 5:
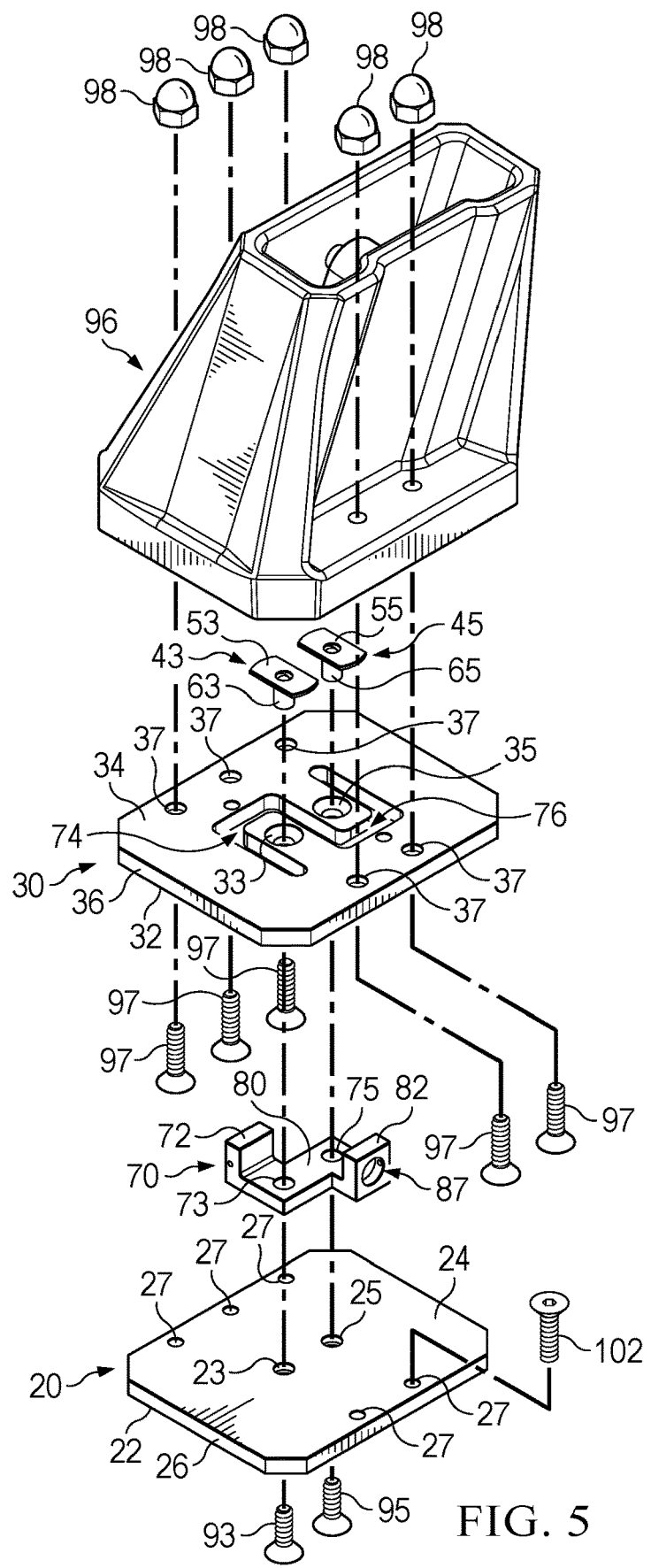
FIG. 5 is an exploded top perspective view depicting the components of FIGS. 1-4 in association with additional components.

Transducer assemblies are described in connection with the views and examples of FIGS. 1-14, wherein like numbers indicate the same or corresponding elements throughout the views. A load cell or transducer assembly in accordance with a first embodiment is described herein with reference to FIGS. 1-11 and 14. The transducer assembly is shown in FIGS. 1 and 5 to include an engagement plate 20. The engagement plate 20 is shown to have a lower surface 22 and an upper surface 24 which are opposite one another. The engagement plate 20 can be integrally formed as a unitary structure such as from steel, aluminum, titanium, another metal, an alloy thereof, or from another material such as plastic, carbon fiber, wood, fiberglass, or another material or combination thereof. In other embodiments, one or more features of an engagement plate can be formed separately and attached to the others such as with welding, adhesive, and/or interlocking mechanical features. In one embodiment, as shown in the example of FIGS. 1 and 5, the engagement plate 20 can be formed from a piece of metal plate, such as by stamping.

It will be appreciated that the engagement plate 20 can comprise a perimeter surface 26 that defines an outer perimeter of the engagement plate 20. While the engagement plate 20 is shown in FIG. 1 to have the shape of a generally rectangular plate, an engagement plate can alternatively be provided in any of a variety of other suitable configurations. In the illustrated configuration, each of the upper surface 24 and the lower surface 22 of the engagement plate 20 are shown to reside within respective planes that are spaced from and parallel with one another. However, it will be appreciated that in other embodiments, upper and lower surfaces of an engagement plate can reside within respective planes that are not parallel with one another, such that they are converging or diverging from one another. The perimeter surface 26 of the engagement plate 20 is shown to have a width extending between and generally perpendicularly to each of the upper surface 24 and the lower surface 22. While the example of FIG. 1 illustrates the perimeter surface 26 to define the engagement plate 20 to have a generally rectangular shape, it will be appreciated that in other embodiments, a perimeter surface of an engagement plate can alternatively define an engagement plate to have an ovular shape, a star shape, or any of a variety of other suitable shapes as will be suitable to facilitate effective securement of the engagement plate to another structure (e.g., a foot or foot pad, such as described below).

Figure 2:
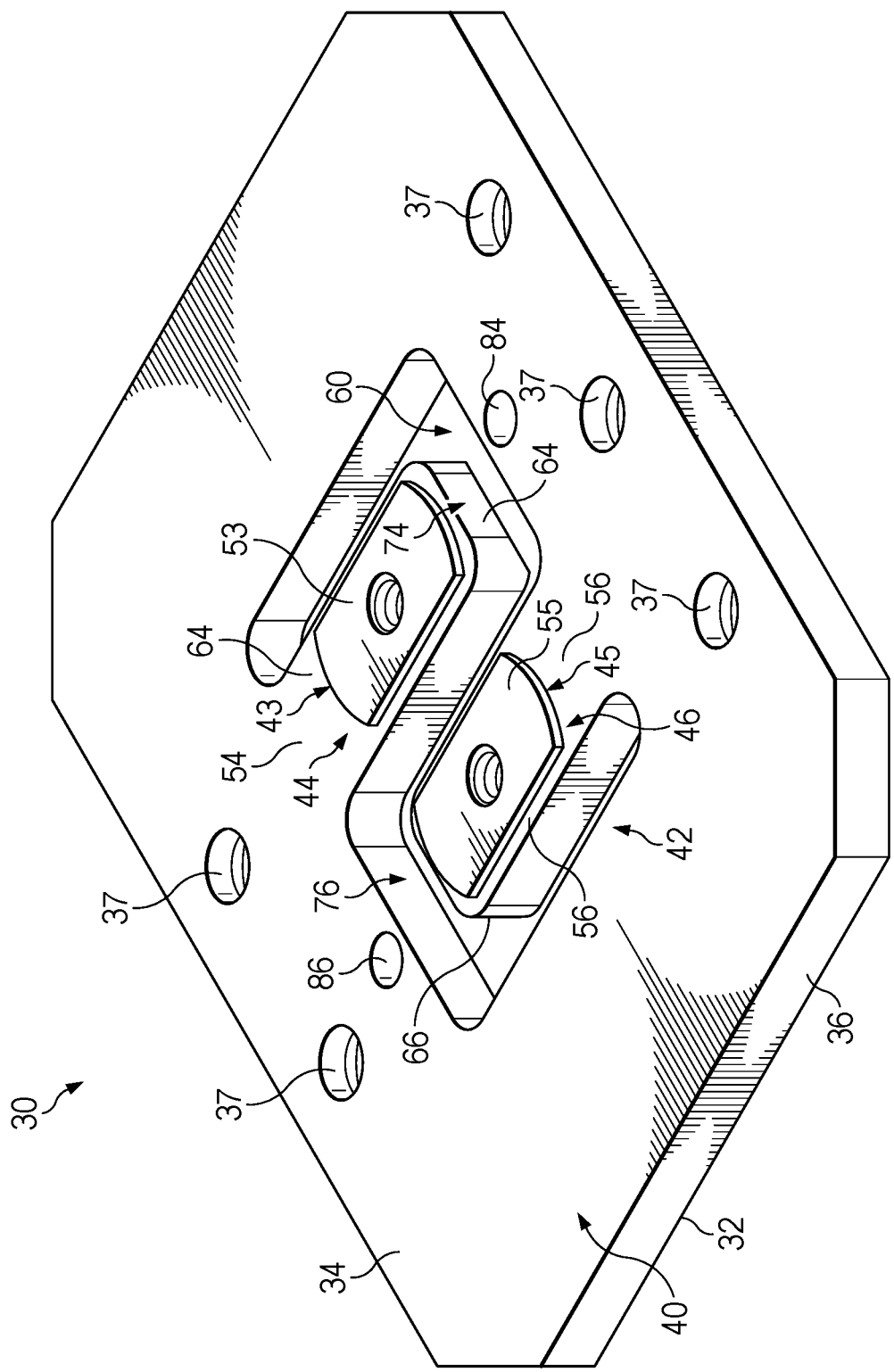
FIG. 2 is a top perspective view depicting certain components of FIG. 1.

The transducer assembly can additionally include a mounting plate 30, as shown for example in FIGS. 1-2. The mounting plate 30 is shown to have a lower surface 32 and an upper surface 34 which are opposite one another. The mounting plate 30 can be integrally formed as a unitary structure such as from steel, aluminum, titanium, another metal, an alloy thereof, or from another material such as plastic, carbon fiber, wood, fiberglass, or another material or combination thereof. In other embodiments, one or more features of a mounting plate can be formed separately and attached to the others such as with welding, adhesive, and/or interlocking mechanical features. In one embodiment, as shown in the example of FIGS. 1-2, the mounting plate 30 can be formed from a piece of metal plate, such as by stamping.

With further reference to FIGS. 1-2, in one embodiment, the mounting plate 30 can include a perimeter region 40 and an inner region 42. The perimeter region 40 is shown to circumscribe the inner region 42. The mounting plate 30 is shown to define an S-shaped cutout 60 extending through the mounting plate 30 from the lower surface 32 to the upper surface 34. The S-shaped cutout 60 is shown to define a first finger region 44 of the inner region 42 and a second finger region 46 of the inner region 42. In this configuration, the first finger region 44 is shown to extend from a proximal end 54 to a distal end 64. The proximal end 54 is shown to be coupled with the perimeter region 40, and the distal end 64 is shown to be spaced from the perimeter region 40 by a gap 74 defined by the S-shaped cutout 60. Likewise, the second finger region 46 is shown to extend from a proximal end 56 to a distal end 66. The proximal end 56 is shown to be coupled with the perimeter region 40, and the distal end 66 is shown to be spaced from the perimeter region 40 by a gap 76 defined by the S-shaped cutout 60. It will therefore be appreciated that, in this configuration for example, the mounting plate 30 can define the S-shaped cutout 60 extending through the mounting plate 30 to define the first finger region 44, the second finger region 46 and the perimeter region 40. In one embodiment, the perimeter region 40 of the mounting plate 30 can define an aperture 84 adjacent to the gap 74 as well as an aperture 86 adjacent to the gap 76. While the respective aperture 84 and 86 are shown to extend completely through the thickness of the mounting plate 30, it will be appreciated that in other embodiments, one or both of such apertures can extend only partially through a mounting plate.

The perimeter region 40 of the mounting plate 30 can comprise a perimeter surface 36 that defines an outer perimeter of the mounting plate 30. While the mounting plate 30 is shown to generally have the shape of a generally rectangular plate, a mounting plate can alternatively be provided in any of a variety of other suitable configurations. In the illustrated configuration, each of the upper surface 34 and the lower surface 32 of the mounting plate 30 are shown to reside within respective planes that are spaced from and parallel with one another. However, it will be appreciated that in other embodiments, upper and lower surfaces of a mounting plate can reside within respective planes that are not parallel with one another, such that they are converging or diverging from one another. The perimeter surface 36 of the mounting plate 30 is shown to have a width extending between and generally perpendicularly to each of the upper surface 34 and the lower surface 32. While the example of FIG. 1 illustrates the perimeter surface 36 to define a mounting plate having a generally rectangular shape, it will be appreciated that in other embodiments, a perimeter surface of a mounting plate can alternatively define a mounting plate having an ovular shape, a star shape, or any of a variety of other suitable shapes as will be suitable to facilitate effective securement of the mounting plate to another structure (e.g., a leg, such as described below). In one embodiment, as in the example of FIG. 1, the outer perimeter of the engagement plate 20 can generally correspond in shape and size with the outer perimeter of the mounting plate 30. However, it will be appreciated that, in other embodiments, the outer perimeter of the engagement plate might not generally correspond in shape and/or size with the outer perimeter of the mounting plate.

The transducer assembly can additionally include a support structure 70 as will be described with reference to FIGS. 1, 4-5 and 7-11. In particular, the support structure 70 is shown to include a base 80, a first tab 72, and a second tab 82. The support structure 70 can be integrally formed as a unitary structure such as from steel, aluminum, titanium, another metal, an alloy thereof, or from another material such as plastic, carbon fiber, wood, fiberglass, or another material or combination thereof. In other embodiments, one or more features of a support structure can be formed separately and attached to the others such as with welding, adhesive, and/or interlocking mechanical features. In one embodiment, the support structure 70 can be formed as a unitary structure, such as through 3D printing, casting, molding or machining.

Figure 7:
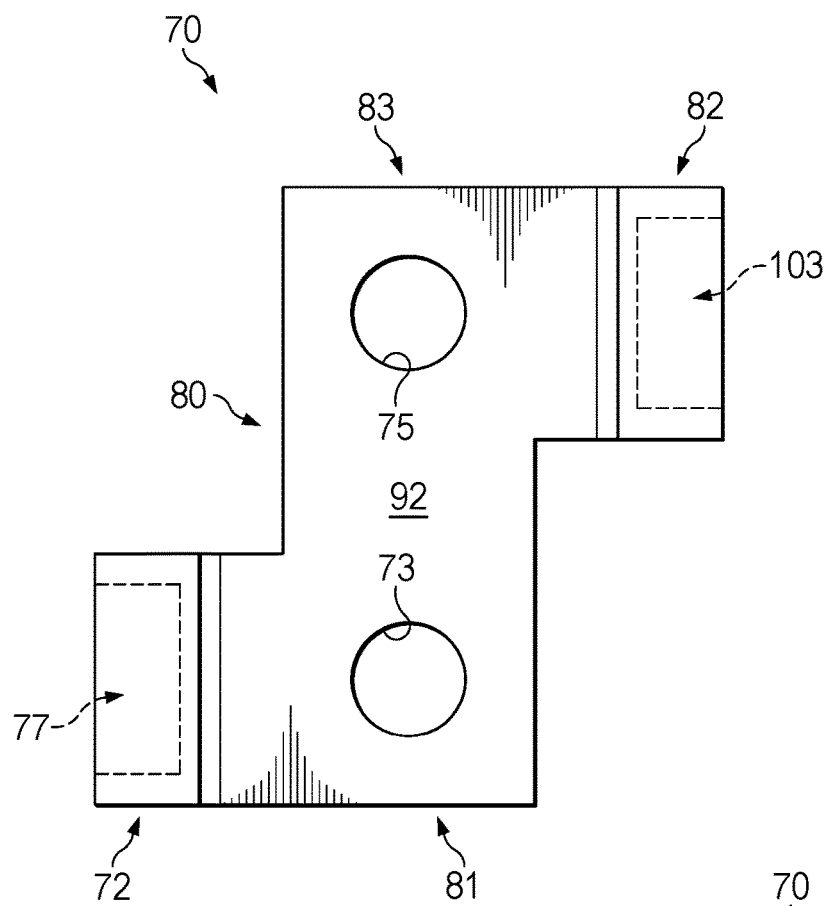
FIG. 7 is a top plan view depicting the support structure of FIGS. 1 and 4.
Figure 8:
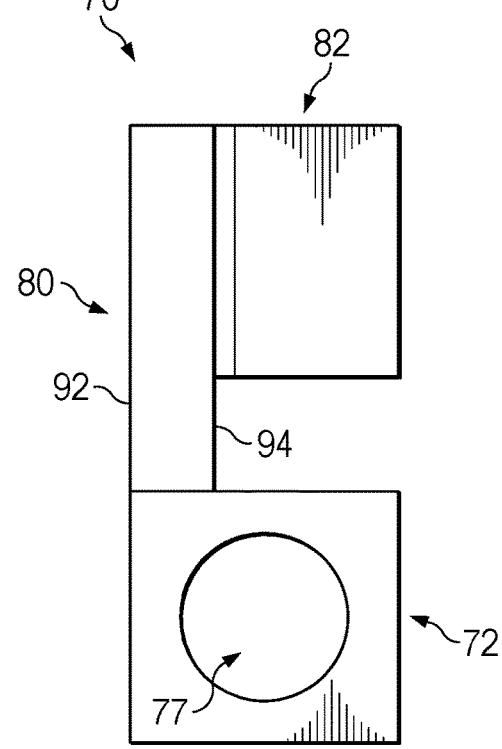
FIG. 8 is a side elevational view depicting the support structure of FIG. 7.

The base 80 of the support structure 70 is shown to extend longitudinally from a first end 81 to a second end 83 (see FIG. 7), and to have a lower surface 92 and an upper surface 94 opposite one another (FIG. 8). In the illustrated configuration, each of the upper surface 94 and the lower surface 92 of the base 80 of the support structure 70 are shown to reside within respective planes that are spaced from and parallel with one another. However, it will be appreciated that in other embodiments, upper and lower surfaces of a base of a support structure can reside within respective planes that are not parallel with one another, such that they are converging or diverging from one another. As shown in FIGS. 7-8, the first tab 72 can extend perpendicularly from the first end 81 of the base 80, and to define a receptacle 77. Likewise, the second tab 82 is shown to extend perpendicularly from the second end 83 of the base 80, and to define a receptacle 103. However, in other embodiments, it will be appreciated that one or more such tabs can extend non-perpendicularly from a base of a support structure. While the respective receptacles 77 and 103 are shown to extend only partially through the thickness of the respective first and second tabs 72 and 82, it will be appreciated that in other embodiments, a receptacle can extend completely through an associated tab.

Each of the engagement plate 20, the mounting plate 30 and the support structure 70 are shown to be provided as discrete components that are attached together such as described below and will be appreciated with reference to the figures. However, in alternative embodiments, it will be appreciated that two or more of these components can be formed integrally together as a unitary structure, such as through machining, casting, 3D printing, or other additive manufacturing process. For example, in a first alternative configuration, an engagement plate and a support structure can be formed integrally together as a unitary structure, which can then be attached (e.g., with fasteners, welding and/or adhesive) to a mounting plate. In a second alternative configuration, a mounting plate and a support structure can be formed integrally together as a unitary structure, which can then be attached (e.g., with fasteners, welding and/or adhesive) to an engagement structure. In a third alternative configuration, a mounting plate, a support structure, and an engagement plate can be formed integrally together as a unitary structure, such as through machining, casting, 3D printing, or other additive manufacturing process.

In one embodiment, the various components of a transducer assembly in accordance with the present disclosure can be assembled as described below with reference to FIGS. 1-11 and 14, though it will be appreciated that a transducer can alternatively be configured and assembled in any of a variety of suitable alternative configurations. Referring to the embodiment of FIGS. 1-11 and 14, the base 80 of the support structure 70 can be sandwiched between the engagement plate 20 and the mounting plate 30. More particularly, the upper surface 94 of the base 80 can be adjacent to portions of the lower surface 32 of the mounting plate 30 corresponding with each of the first finger region 44 and the second finger region 46. Further, the lower surface 92 of the base 80 can be adjacent to the upper surface 24 of the engagement plate 20. In one embodiment, the base 80 contacts at least one of, or each of, the engagement plate 20, the first finger region 44 and the second finger region 46. More particularly, in the embodiment illustrated in FIGS. 1-11 and 14, the upper surface 94 of the base 80 can contact portions of the lower surface 32 of the mounting plate 30 corresponding with each of the first finger region 44 and the second finger region 46, while the lower surface 92 of the base can contact the upper surface 24 of the engagement plate 20. In one embodiment, and as in the example of FIGS. 1-11 and 14, when assembled as described above, it will be appreciated that no portion of the perimeter region 40 of the mounting plate 30 can overlie the base 80 of the support structure 70. In the illustrated configuration in which the base 80 is sandwiched between the engagement plate 20 and the mounting plate 30, the first tab 72 can extend into the gap 74 and the second tab 82 can extend into the gap 76.

A transducer assembly can further include first and second Hall effect sensor assemblies. Each of such Hall effect sensor assemblies can include a magnet and a Hall effect sensor provided in magnetic proximity to one another. More particularly, a first Hall effect sensor assembly can be configured to detect movement of the first tab 72 within the gap 74, and a second Hall effect sensor assembly can be configured to detect movement of the second tab 82 within the gap 76. To facilitate this, in a first configuration, a magnet 78 (FIG. 4) can be at least partially disposed and fixedly coupled within the aperture 84 (FIG. 1) in the mounting plate 30, and a magnet 88 (FIG. 4) can be at least partially disposed and fixedly coupled within the aperture 86 (FIG. 1) in the mounting plate 30. For example, as will be appreciated with reference to FIG. 4, the magnets 78 and 88 can be entirely disposed and fixedly coupled within the respective apertures 84 and 86, such as through use of adhesive and/or friction fit. While not required, provision of the apertures 84 and 86 can facilitate convenient provisioning of the magnets 78 and 88 in a desired orientation (e.g., relative to the first and second tabs 72 and 82, respectively) so as to facilitate reliable and efficient manufacturing of the transducer assembly. As noted, adhesive can be provided to facilitate fixed coupling of one or both of the magnets 78 and 88 to the mounting plate 30 and within the respective apertures 84 and 86. For example, the adhesive can comprise an epoxy resin or potting compound which can be configured to seal and provide protection to one or both of the magnets 78 and 88. In this configuration and when fully assembled, it will be appreciated that one or both of the magnets 78 and 88 can fully reside within the respective apertures 84 and 86 and thus be prevented from being contacted or damaged by moisture, other components of the transducer assembly, or items external to the transducer assembly. In one embodiment, the magnets 78 and 88 can each comprise a permanent magnet, though in other embodiments one or more magnets can instead be an electromagnet or otherwise.

Figure 9:
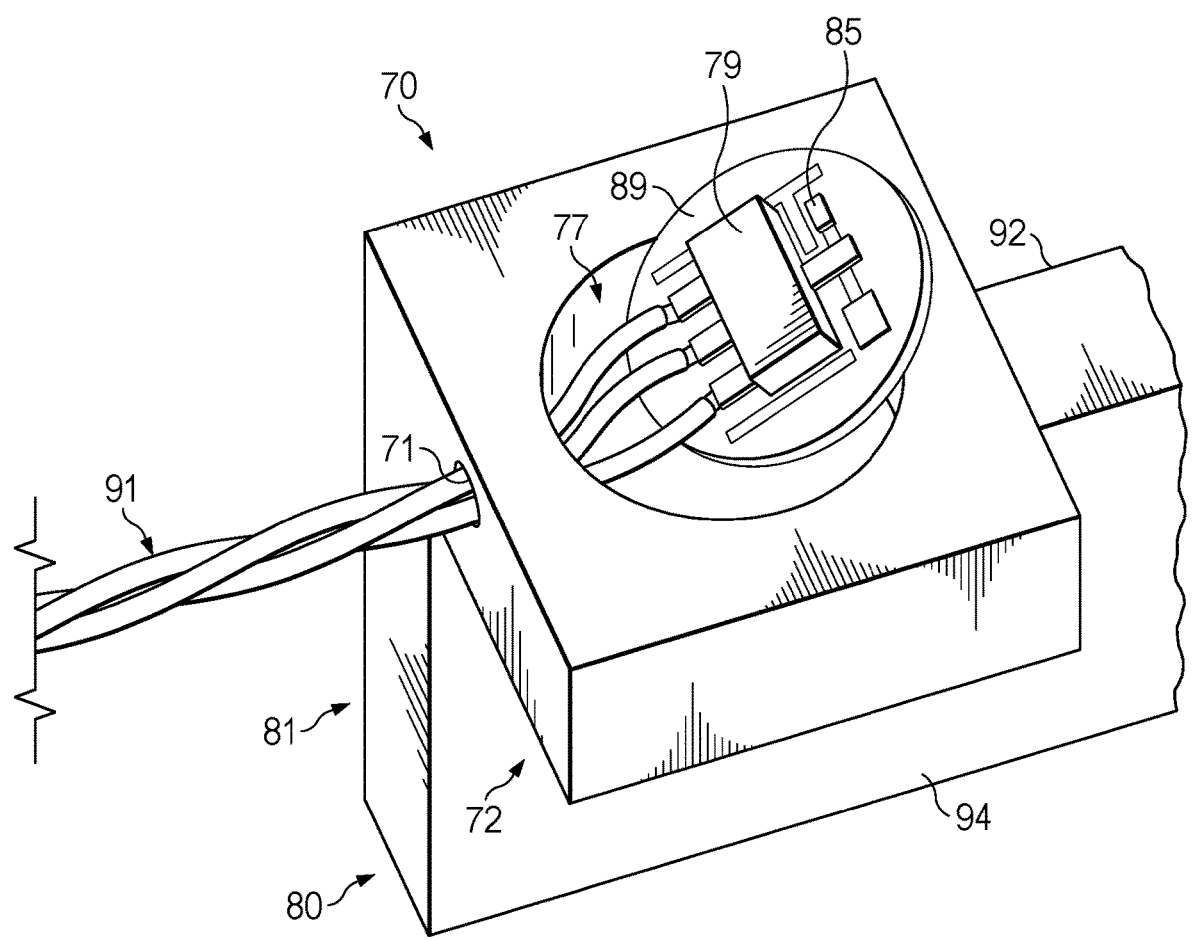
FIG. 9 is a partially exploded top perspective view depicting a portion of the support structure of FIG. 7 in association with additional components.
Figure 10:
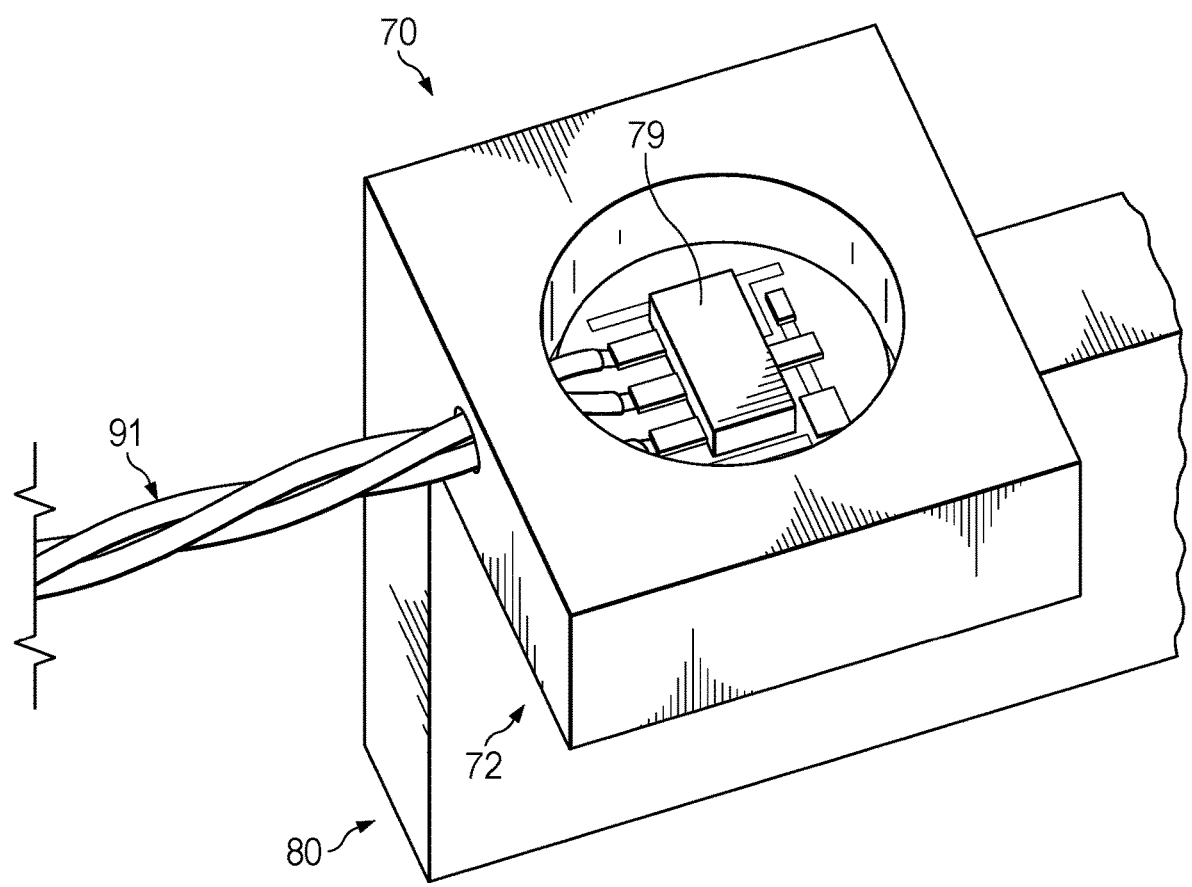
FIG. 10 is a top perspective view depicting the arrangement of FIG. 9 as assembled.

As will be appreciated with reference to FIGS. 7-11, a Hall effect sensor 79 can be at least partially disposed and fixedly coupled within the receptacle 77 in the first tab 72. Likewise, a Hall effect sensor 87 can be at least partially disposed and fixedly coupled within the receptacle 103 in the second tab 82. More particularly, as can be seen in FIG. 9, the Hall effect sensor 79 can be mounted to a circuit board 89. A capacitor 85 can also be mounted to the circuit board 89 and electrically coupled with the Hall effect sensor 79. Wires 91 extending from the circuit board 89 can pass through an aperture 71 from within the receptacle 77. When fully assembled, the circuit board 89, the Hall effect sensor 79, and the capacitor 85 can be at least partially or entirely disposed within the receptacle 77 of the first tab 72, as shown in FIG. 10. Similarly, as will be appreciated with reference to FIG. 11, the Hall effect sensor 87 and a capacitor 100 can be mounted to a circuit board 101 and electrically coupled with one another, such that they are at least partially or entirely disposed within the receptacle 103 of the second tab 82, with wires 99 leading therefrom. While not required, provision of the receptacles 77 and 103 in the first and second tabs 72 and 82 can facilitate convenient provisioning of the Hall effect sensors 79 and 87 in a desired orientation (e.g., relative to the magnets 78 and 88, respectively) so as to facilitate reliable and efficient manufacturing of the associated transducer assembly. Adhesive can be provided to facilitate fixed coupling of one or both of the Hall effect sensors 79 and 87 and any associated components (e.g., circuit boards 89 and 101 and capacitors 85 and 100) to the support structure 70 and within the respective receptacles 77 and 103. For example, the adhesive can comprise an epoxy resin or potting compound which can be configured to seal and provide protection to one or both of the Hall effect sensors 79 and 87. In this configuration and when fully assembled, it will be appreciated that one or both of the Hall effect sensors 79 and 87 can fully reside within the respective receptacles 77 and 103 and thus be prevented from being contacted or damaged by other components of or external to the transducer assembly.

Alternatively, in a second configuration, it will be appreciated that magnets can be disposed at least partially or completely within respective receptacles of respective tabs of a support structure, while Hall effect sensors (together with any associated circuit boards and/or capacitors) can be disposed at least partially or completely within respective apertures of a mounting plate. Alternatively, in a third configuration, a transducer assembly can have a first Hall effect sensor assembly provided in the first configuration (i.e., the embodiment of FIGS. 1-11 and 14) and a second Hall effect sensor assembly provided in the second configuration. It will also be appreciated that, in still further configurations, magnets and Hall effect sensors of a transducer assembly can be provided in any of a variety of other suitable arrangements which may or may not involve use of aperture(s) and/or receptacle(s). Regardless of whether assembled in the first configuration, the second configuration, the third configuration, or another configuration, in response to force transmitted between the lower surface of the engagement plate and the upper surface of the mounting plate, magnets can be configured to slide by respective corresponding Hall effect sensors. For example, in the first configuration as described above, in response to force transmitted between the lower surface 22 of the engagement plate 20 and the upper surface 34 of the mounting plate 30, the magnet 78 can be configured to slide by the Hall effect sensor 79, and the magnet 88 can be configured to slide by the Hall effect sensor 87. The Hall effect sensors (e.g., 79 and 87) can be configured to detect the relative movement (e.g., slide by movement) of the magnets (e.g., 78 and 88) resulting from such transmitted force.

Referring to FIG. 5, the transducer assembly can further include a first fastener and a second fastener such as, for example, bolts 93 and 95. The engagement plate 20 can define a first engagement plate alignment aperture 23 and a second engagement plate alignment aperture 25, each extending through the engagement plate 20 from the lower surface 22 to the upper surface 24. The base 80 of the support structure 70 is shown to define a first base alignment aperture 73 and a second base alignment aperture 75, each extending through the base 80 from the lower surface 92 to the upper surface 94. The first finger region 44 (FIG. 1) of the mounting plate 30 is shown to define a first mounting plate alignment aperture 33 extending through the first finger region 44 from the lower surface 32 to the upper surface 34. Likewise, the second finger region 46 (FIG. 1) of the mounting plate 30 is shown to define a second mounting plate alignment aperture 35 extending through the second finger region 46 from the lower surface 32 to the upper surface 34. As can be appreciated from FIGS. 1 and 5, the bolt 93 can extend sequentially through each of the first engagement plate alignment aperture 23, the first base alignment aperture 73, and the first mounting plate alignment aperture 33. Likewise, the bolt 95 can extend sequentially through each of the second engagement plate alignment aperture 25, the second base alignment aperture 75, and the second mounting plate alignment aperture 35.

In one embodiment, a threaded end of the bolt 93 can be received within an internally threaded barrel 63 of a T-nut 43, and a threaded end of the bolt 95 can likewise be received within an internally threaded barrel 65 of a T-nut 45. In such a configuration, when the bolts 93 and 95 are tightened, at least a portion of the internally threaded barrels 63 and 65 can extend into the first and second mounting plate alignment apertures 33 and 35, respectively, and respective plates 53 and 55 of the T-nuts 43 and 45 can bear against the upper surface 34 of the mounting plate 30. In an alternative embodiment, the T-nuts may be replaced with hex nuts, square nuts, or other types of nuts. In still another embodiment, the T-nuts can be omitted, the first and second mounting plate alignment apertures 33 and 35 can be threaded, and the bolts 93 and 95 can respectively thread into the first and second mounting plate alignment apertures 33 and 35. In still another alternative embodiment, the first fastener and the second fastener might not comprise bolts, but may instead comprise rivets or other suitable fasteners. In yet another alternative embodiment, the first and second fasteners can be replaced by respective spot welds or other mechanical connections.

The transducer assembly can be configured for attachment to other structures such as to facilitate its measurement of relative forces between those structures. For example, referring to FIG. 1, the engagement plate 20 is shown to define a plurality of engagement plate interface apertures 27 which each extend through the engagement plate 20 from the lower surface 22 to the upper surface 24. Similarly, the perimeter region 40 of the mounting plate 30 is shown to define a plurality of mounting plate interface apertures 37 which each extend through the mounting plate 30 from the lower surface 32 to the upper surface 34. While five engagement plate interface apertures 27 and five mounting plate interface apertures 37 are shown in FIG. 1, it will be appreciated that a transducer assembly can alternatively include fewer or greater of either or each, or perhaps even none of either or each, as will be described with reference to FIGS. 12-13 for example.

Figure 3:
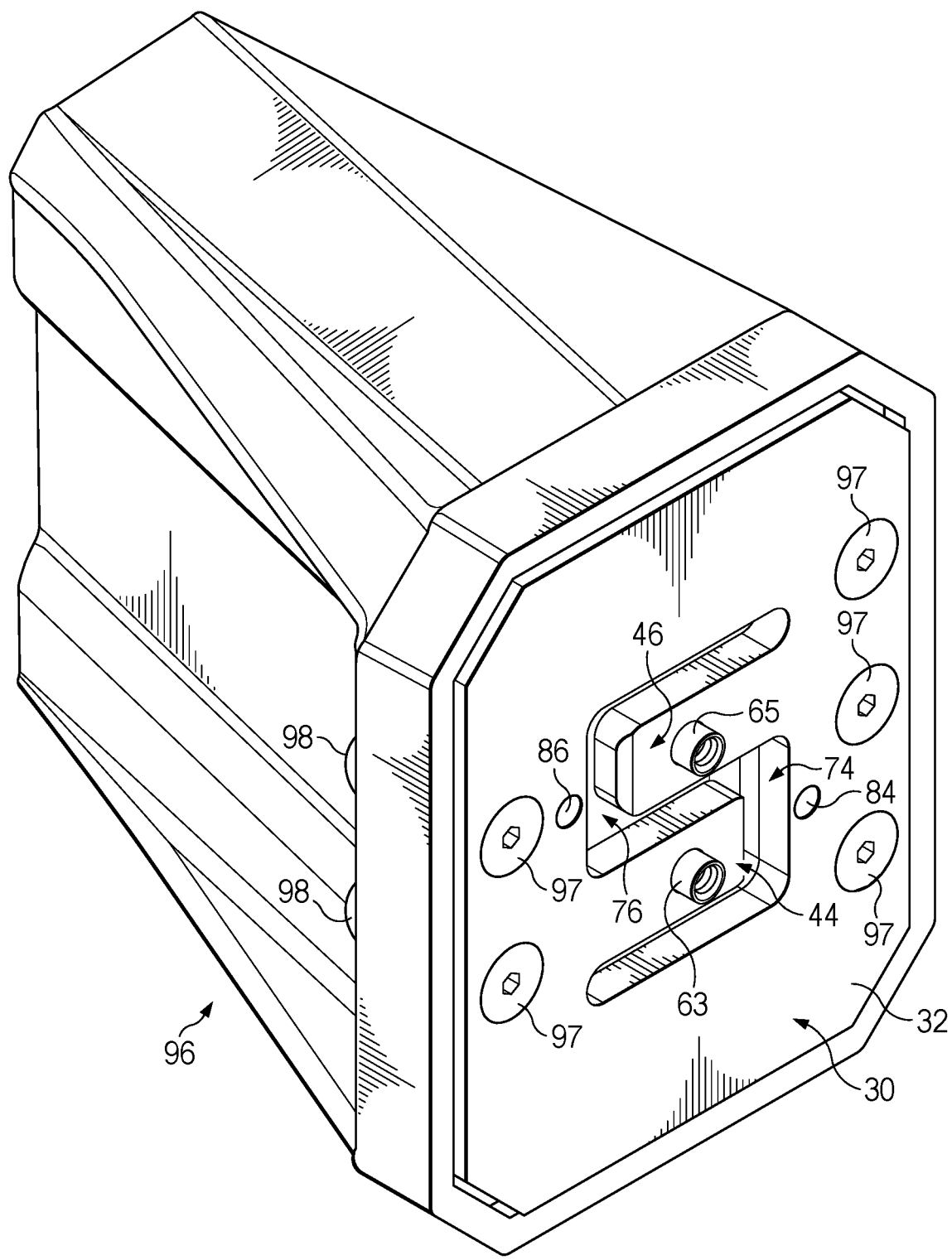
FIG. 3 is a bottom perspective view depicting the components of FIG. 2 attached to a leg with fasteners in accordance with one embodiment.

In one example, the transducer assembly can be configured to provide a load path between a leg and a foot of a piece of equipment. The foot can be configured for resting upon a ground surface and transmitting load from the leg to the ground surface. In such an example, and referring to FIGS. 3-6, a foot 90 can be coupled with the engagement plate 20 of the transducer assembly, and a leg 96 can be coupled with the mounting plate 30 of the transducer assembly, such as through use of any of a variety of suitable interface fasteners. For example, bolts 97 are shown in FIGS. 3-5 as extending through respective ones of the mounting plate interface apertures 37, through respective apertures in the leg 96, and into respective nuts 98, thereby serving to facilitate attachment of the mounting plate 30 to the leg 96. In one embodiment, adhesive such as epoxy can additionally be provided to facilitate attachment of the mounting plate 30 to the leg 96. While five bolts 97 are illustrated as performing this function, it will be appreciated that, in other embodiments, fewer or more than five bolts may be used, alternative fasteners (e.g., rivets) can be used, or a mounting plate can be attached to a leg without use of fasteners such as solely through use of adhesive, interference fit, welding or the like. In the illustrated configuration of FIGS. 1-11 and 14, it can be seen that the perimeter surface 36, general configuration of the upper surface 34, and outer perimeter of the mounting plate 30 can each be suitable to facilitate an effective mating interface between the transducer assembly and the leg 96. It will be appreciated that, in other embodiments, a mounting plate can have any of a variety of other suitable configurations and can be effectively secured to another structure (e.g., a leg) without use of fasteners such as bolts, rivets, studs, or the like, and instead can involve use of welds, adhesives, interlocking mechanical features, or through integral unitary formation therewith, for example.

Likewise, bolts or other fasteners (e.g., 102 in FIGS. 5 and 6) can extend through the foot 90 and into respective ones of the engagement plate interface apertures 27. In one embodiment, adhesive such as epoxy can additionally be provided to facilitate attachment of the engagement plate 20 to the foot 90. While five engagement plate interface apertures 27 are illustrated as being configured to facilitate this function, it will be appreciated that, in other embodiments, fewer or more than five engagement plate interface apertures and/or bolts may be used, alternative fasteners (e.g., rivets) can be used, or an engagement plate can be attached to a foot without use of fasteners, such as solely through use of adhesive, interference fit, welding or the like. In the illustrated configuration of FIGS. 1-11 and 14, it can be seen that the perimeter surface 26, general configuration of the lower surface 22, and outer perimeter of the engagement plate 20 can each be suitable to facilitate an effective mating interface between the transducer assembly and the foot 90. However, it will be appreciated that in other embodiments, an engagement plate can have any of a variety of other suitable configurations and can be effectively secured to another structure (e.g., a foot) without use of fasteners such as bolts, rivets, studs, or the like, and instead can involve use of welds, adhesives, interlocking mechanical features, or through integral unitary formation therewith, for example.

Figure 6:
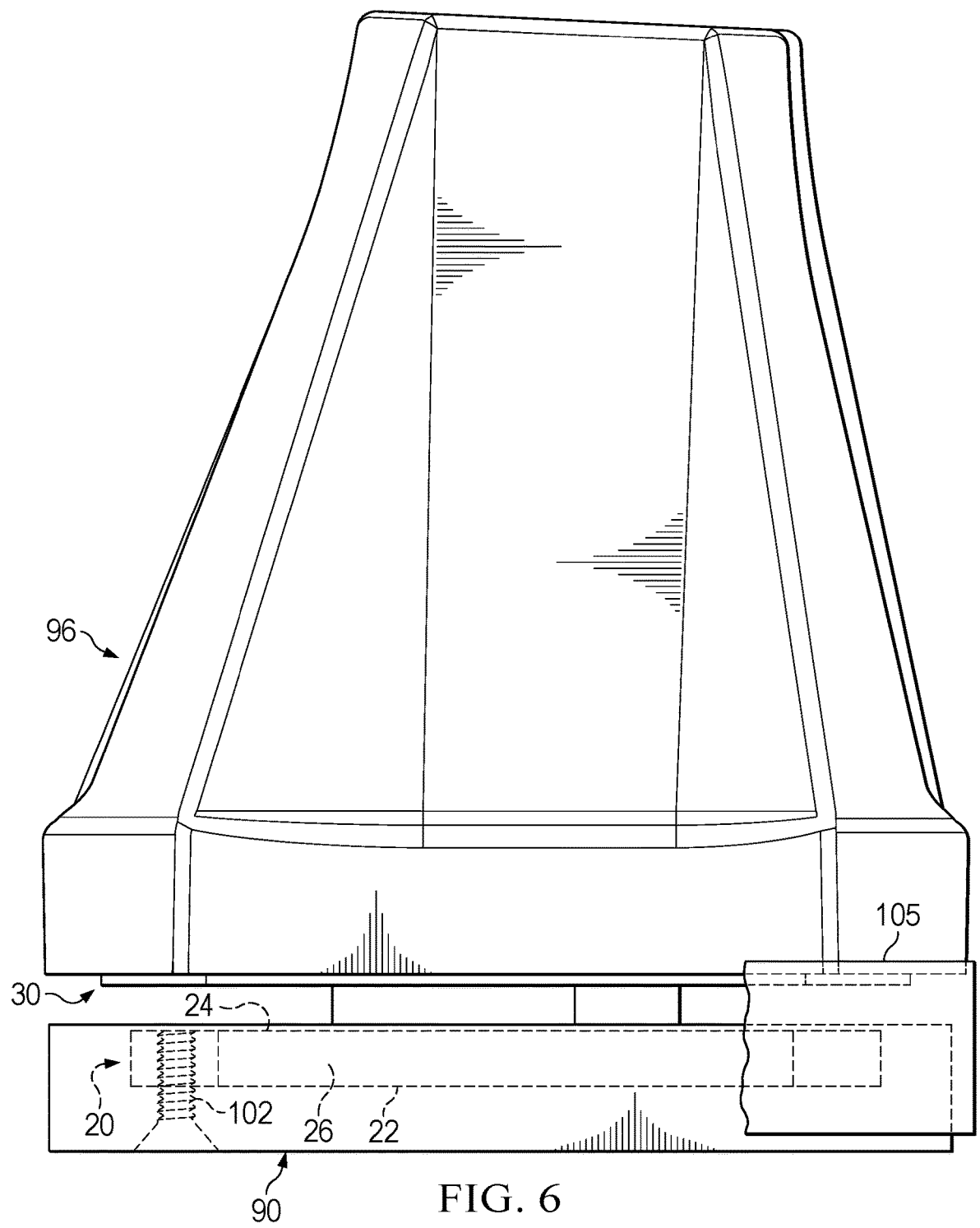
FIG. 6 is a side elevational view depicting the components of FIG. 5 as assembled and in association with a foot.

In one embodiment, it will be appreciated that a sealant and/or sealing member can be provided to facilitate sealing between an outer perimeter of an engagement plate and an outer perimeter of a mounting plate, so as to prevent moisture and/or debris from accessing space between the engagement plate and the mounting plate. However, it will be appreciated that, if any such sealant and/or sealing member is/are provided, it can be sufficiently pliable as to not substantially interfere and/or inhibit the relative movement between the engagement plate and the mounting plate as described herein as facilitating operation of the transducer assembly. Examples of sealant can include, for example, epoxy, silicone, urethane and foam. An example of a sealant member can include, for example, a band that circumferentially surrounds the transducer assembly and its interface with adjacent components, such as a leg and a foot. For example, a portion of a band 105 is illustrated in FIG. 6 as covering the transducer assembly and overlapping a portion of the foot 90 and the leg 96, and thus preventing entry of moisture and/or debris from accessing space between the engagement plate 20 and the mounting plate 30. In one embodiment, the band 105 can comprise a heat shrinkable material or cold shrinkable material, and can generally resemble what is colloquially referred to as a "rubber band" that wraps entirely around and conceals the transducer assembly and its respective interfaces with the foot 90 and the leg 96. In another embodiment, adhesive can be provided to facilitate sealing and retention of the band 105 about its respective lateral edges to each of the engagement plate 20 and the mounting plate 30. It will be appreciated that a transducer assembly can be provided with sealant(s) and/or sealing member(s) in any of a variety of suitable alternative configurations.

When the transducer assembly is fully assembled, the distal end 64 of the first finger region 44 and associated first tab 72 can extend toward the perimeter region 40 of the mounting plate 30, but without touching the perimeter region 40 of the mounting plate 30. Likewise, the distal end 66 of the second finger region 46 and associated second tab 82 can extend toward the perimeter region 40 of the mounting plate 30, but without touching the perimeter region 40 of the mounting plate 30. In this configuration, it will be appreciated that the first and second tabs 72 and 82 can be free to move within the respective gaps 74 and 76, without contacting or dragging against the perimeter region 40 of the mounting plate 30 or other portions of the transducer assembly during movement of the mounting plate 30 relative to the engagement plate 20 during use of the transducer assembly as described herein.

Figure 11:
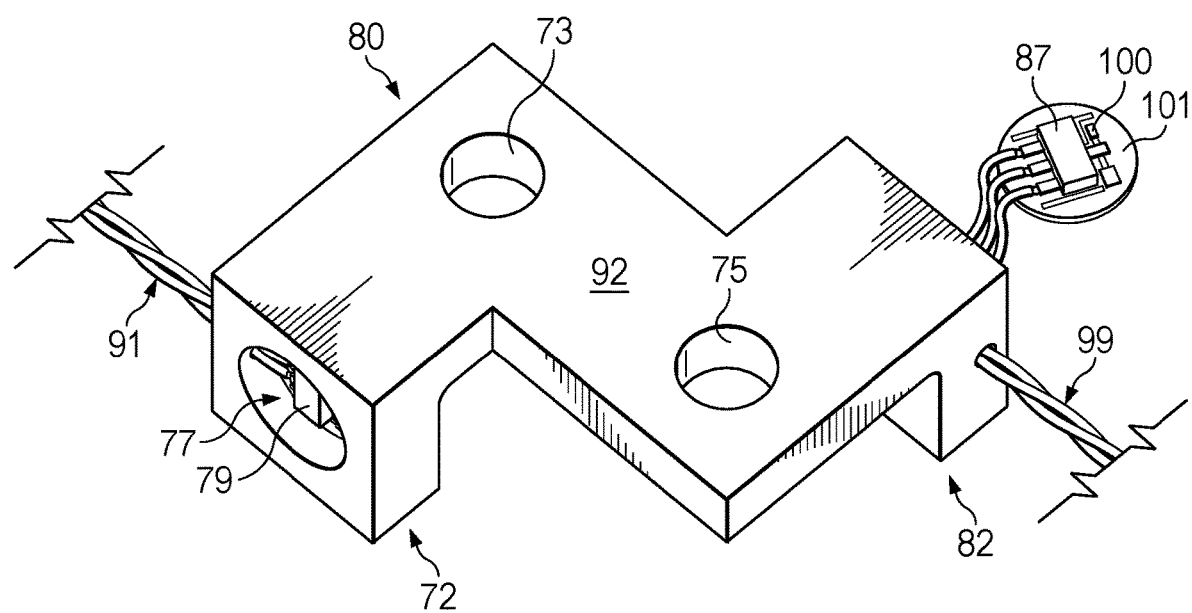
FIG. 11 is a partially exploded bottom perspective view depicting the support structure of FIG. 7 in association with additional components, including but not limited to those of FIGS. 9-10.

When assembled in this manner, it will be appreciated that the Hall effect sensor 79 can be spaced longitudinally from the magnet 78, and can thus be configured to detect movement of the first tab 72. Likewise, the Hall effect sensor 87 can be spaced longitudinally from the magnet 88, and can thus be configured to detect movement of the second tab 82. When assembled in this manner, the Hall effect sensors 79 and 87 can be spaced from the magnets 78 and 88, respectively, to produce in each instance a design-specific total effective gap (TEG). More particularly, with the Hall effect sensors 79 and 87 provided in the package of a respective chip as generally shown in FIGS. 9-11, it will be appreciated that a Hall effect element can be provided at a precise location by the manufacturer (within a few microns) within the chip package of each of the respective Hall effect sensors 79 and 87. The total effective gap can be measured as the distance between a Hall effect element and a face of a magnet, and is a design parameter that, for any given magnet, determines the level of magnetic saturation/strength that an associated Hall effect element will experience, and therefore can affect or determine what sensitivity of the associated Hall effect element is desired or required. The structure, function and operation of the described Hall effect sensor(s) can further be appreciated with reference to U.S. Pat. App. Ser. No. 63/334,343 which was filed Apr. 25, 2022, U.S. patent application Ser. No. 17/830,758 which was filed Jun. 2, 2022, and U.S. patent application Ser. No. 17/864, 959 which was filed Jul. 14, 2022, the entire disclosure of each of which is hereby incorporated by reference herein in its entirety. However, it will be appreciated that, in alternative embodiments, a Hall effect sensor of a transducer assembly can be provided in any of a variety of other suitable configurations.

In use, when the mounting plate 30 is fixedly attached to a piece of equipment and a force is applied through the transducer assembly (e.g., to a foot 90 resting upon a ground surface), that force can be transmitted by and through the transducer assembly. In so doing, and in some proportion to the amount and direction of the force, the mounting plate 30 can move relative to the engagement plate 20, and the first and second tabs 72 and 82 can resultantly move within the respective gaps 74 and 76, thereby resulting in movement of Hall effect sensors 79 and 87 relative to the respective magnets 78 and 88. Monitoring signals generated by the Hall effect sensors 79 and 87 and transmitted over respective wires 91 and 99 can reveal the amount of movement, and the amount and direction of force can be determined therefrom as will be appreciated.

In this configuration, it will be appreciated that the transducer assembly can be configured to facilitate movement of the mounting plate relative to the engagement plate in more than a single direction or in more than one axis, and as such can be considered of a double or multiple bending type. As such, a transducer assembly can facilitate bending or pivoting movement, for example, in directions that are orthogonal or generally orthogonal to one another. More particularly, a first direction can include an x-axis component resulting from side-to-side movement of the mounting plate 30 relative to the engagement plate 20 (see L-R in FIG. 5), while the a second direction can include a y-axis component resulting from front-to-back movement of the mounting plate 30 relative to the engagement plate 20 (see F-A in FIG. 5). It will be appreciated that, by monitoring both Hall effect sensors 79 and 87 of the transducer assembly, the movements in each of these directions can be determined. While the transducer assembly is described to include two pairs of Hall effect sensors and magnets (e.g., 79,87 and 78, 88), it will be appreciated that in other embodiments a transducer assembly can comprise fewer or greater than two such pairs.

Application of force through the transducer assembly can result in temporary bending of the first finger region 44 and the second finger region 46, relative to the perimeter region 40, which can facilitate relative movement of the first tab 72 and the second tab 82 and corresponding movement (e.g., slide by movement) of the magnets 78 and 88 relative to the respective Hall effect sensors 79 and 87 of the transducer assembly. The Hall effect sensors 79 and 87 can detect this movement of the associated magnets 78 and 88 and can generate and transmit electrical signals reflecting the magnitude of this bending and movement. Based upon the electrical signals received from the Hall effect sensors 79 and 87, associated electronics (not shown) can identify and display to a user an amount and direction of the force transmitted through the transducer assembly (e.g., from the leg 96 to the foot 90).

Assuming that the configuration and material of the mounting plate 30 are suitably selected for a particular application, it will be appreciated that movement of the first finger region 44 and the second finger region 46, each relative to the perimeter region 40, can be temporary in response to application of a force to the transducer assembly. Namely, the first finger region 44 and the second finger region 46 can resume their typical non-bent or non-distorted configuration (as shown in FIGS. 1-5) upon removal of the force from the transducer assembly. In one embodiment, it will be appreciated that the amount of bending or distortion of the first finger region 44 and the second finger region 46 can be in linear or non-linear proportion to the amount of force applied to the transducer assembly depending upon, for example, the configuration and material of the mounting plate 30.

It will be appreciated that the amount of deflection or bending of the first finger region 44 and the second finger region 46 resulting from application of force to the transducer assembly can be determined based upon factors such as the thickness of the mounting plate 30, the width and other dimensions of the first finger region 44 and the second finger region 46, whether and to what extent any scoring or other treatment is provided in the mounting plate 30 at the proximal ends 54 and 56 of the first and second finger regions 44 and 46, and the material and process forming the mounting plate 30. Engineering design of the mounting plate 30 can be accomplished for specific applications of the transducer assembly to ensure that the mounting plate 30 is strong enough to survive without permanent deformation under any loading it will receive in normal use, yet flexible enough to allow adequate compliance to facilitate measurable deflection to accomplish measurement of loading or force. If the mounting plate 30 is too weak for a particular application, the mounting plate 30 can permanently bend or deform in use, resulting in subsequent inoperability of the transducer assembly. However, if the mounting plate 30 is too strong, the mounting plate 30 may not adequately bend under loading to facilitate measurement thereof. The mounting plate 30 can therefore optimally be over-designed by a specific amount in order allow some bending yet withstand permanent deformation in response to a particular loading, e.g., by a factor of about 2.5, or by another factor. In this example, the mounting plate 30 can experience bending or deflections large enough to facilitate measurements through use of the Hall effect as described herein, but stresses that are low enough so that it will survive without deformation in use. Therefore, assuming that the configuration and material of the mounting plate 30 are suitably selected for a particular application, it will be appreciated that such bending of the first finger region 44 and the second finger region 46 can be temporary in response to application of the force, and that the mounting plate 30 will resume its typical non-bent configuration (as shown in FIGS. 1-5) upon removal of the force. In one specific example, the mounting plate 30 can be formed of aluminum and have a thickness of less than or equal to about 0.125 inches. In this example, the transducer assembly can be configured such that, if mounted to a leg of a stepladder rated for 350 pounds, upon application of a 700 pound weight onto that stepladder, the first finger region 44 and the second finger region 46 can deflect by about 0.023 inches, while returning to their original positions when load is removed, with no permanent deformation.

While the embodiment of FIGS. 9-11 illustrates, for example, the Hall effect sensor 79 and capacitor 85 being attached to the circuit board 89, it will be appreciated that, in other embodiments, a transducer assembly can instead include a custom packaged Hall effect sensor assembly which includes an internal capacitor, and from which wires (e.g., similar to 91) can directly extend. The custom packaged Hall effect sensor assembly can have a size, form factor and shape that beneficially corresponds with the desired characteristics of the transducer assembly and can, for example, have some similarity to that of a standard package such as SOT23, TO-92, TO252, TO220, or otherwise. It will be appreciated that a custom packaged Hall effect sensor can individually be expensive when ordered in small quantities (e.g., less than 100,000 units). But when budgets and/or quantities can justify, use of a custom packaged Hall effect sensor within a transducer assembly might generally be deemed a more elegant solution. However, in relatively low quantities, use of a conventional off-the-shelf Hall effect sensor can just as effectively be used, such as by mounting it to a custom-designed circuit board (e.g., as shown in FIGS. 9-11).

In one specific custom configuration of a transducer assembly having two Hall effect sensors as described herein, it will be appreciated that both Hall effect sensors can be provided as part of a custom unitary flex structure, such that the entirety of the locally-disposed electronic components of a transducer assembly can reside within the custom unitary flex structure. In such a configuration, the custom unitary flex structure can be configured to remotely harness power and communicate wirelessly, or alternatively can be coupled by wires, e.g., a four-conductor ribbon cable, to remotely-mounted electronics. In such a configuration, for example, a stepladder can include a total of four custom unitary flex structures, with one at the foot of each leg, and which can each be coupled using a respective four-conductor ribbon cable to a control unit disposed near the top of the stepladder.

In one embodiment, wires 91 can include three distinct wires, namely a power wire, a ground wire and a signal wire. Power can be provided to the Hall effect sensor 79 through use of the power wire and the ground wire. In use, the Hall effect sensor 79 can produce an electrical signal indicative of the amount of movement of the mounting plate 30 relative to the engagement plate 20, which can be transmitted by and received from the Hall effect sensor 79 by way of the signal wire such as in the form of a 0-5 V, 4-20 mA, PWM, or binary data signal corresponding to its measured position of the magnet 78. In an alternative embodiment, it will be appreciated that fewer than three or more than three wires can lead to a Hall effect sensor of a transducer assembly. For example, in one alternative embodiment, only a single wire can lead to a Hall effect sensor, thereby providing power thereto, in which case ground can be received by the Hall effect sensor through a conductive support structure, and a signal can then be selectively superimposed by the Hall effect sensor upon the single wire or transmitted wirelessly from the Hall effect sensor assembly. In yet another alternative embodiment, a Hall effect sensor assembly can be configured not to receive any wires, and instead can comprise power harvesting circuit and/or data communications circuits (e.g., near field communications) within its package. Based upon an electrical signal received through the wires (e.g., 91) or wirelessly from the Hall effect sensor 79, an amount of force applied to the transducer assembly can be identified. It will be appreciated that the wires 99 can be configured and function similarly to the wires 91, in one embodiment. It will further be appreciated that each of the configuration, operation and alternatives described herein relative to the Hall effect sensor 79 are similarly applicable to the Hall effect sensor 87.

It will be appreciated that, by associating the transducer assembly with an element directly within a load path, as shown in the examples of FIG. 6, the transducer assembly 10 can directly measure characteristics of a load experienced by that element in the particular application, without experiencing friction or interference which may be introduced by other ancillary structures. For example, in certain conventional configurations, frictional losses must otherwise be taken into account to approximate changes in force experienced by a structure. Unlike such conventional configurations, provision of a transducer assembly into the load path as described herein can facilitate a more direct and reliable measurement and approximation of changes in force experienced by the structure.

In conventional applications, high precision force determinations often involve use of strain gauges which are glued or otherwise attached onto force-bearing structural members. Monitoring of changes in resistance of the strain gauges can reveal the amount of deflection and force associated with the structural members. Strain gauges can provide challenges in application because they can be difficult to position and attach, have a relatively large form factor, have a tendency to fail or be damaged easily, require relatively complex signal processing circuitry, require relatively significant power for operation, and are relatively expensive.

In the examples described herein, a transducer assembly can be designed to allow for deflections under load, such as by allowing movement of the mounting plate relative to the engagement plate. In this way and by allowing for movement, the transducer assemblies as described herein can in certain ways be analogous to conventional sensors involving a strain gauge configuration, but instead involve measurement accomplished through use of magnets and Hall effect sensors. Use of a Hall effect sensor in a transducer assembly can provide advantages as compared with use of a strain gauge. For example, while Hall effect sensors can be suitably used as described above, it can be difficult to obtain and/or reliably position a strain gauge into the very small spaces required of certain embodiments of the transducer assemblies as described herein (e.g., see FIGS. 1-11 and 14). Also, while Hall effect sensors can be energy efficient and provide high level output signals, strain gauges require excessive energy and can require signal processing and/or amplification to reach suitably high levels. Furthermore, the transducer assemblies as described herein can be constructed through use of inexpensive, readily available, off-the-shelf Hall effect sensors (see e.g., FIGS. 9-11).

While Hall effect sensors can be used in a head on or slide by configuration, the illustrated embodiments employ use of a Hall effect sensor in a slide by configuration. The unique geometry of the transducer assembly configurations facilitate sliding of the magnet by and relative to the Hall effect sensor to represent forces associated with loads upon the transducer assemblies. In certain configurations of a transducer assembly as described herein, under normal intended loading of the transducer assembly, the amount, direction and type of movement of the mounting plate relative to the engagement plate, and resulting slide by movement of the magnet relative to the Hall effect sensor, can be typically on the order of from 0.001 to 0.010 inches. It will be appreciated that these are very small levels of deflection, not typically perceivable by the human eye, well within suitable parameters for reliable design, and normally experienced by typical components of a mechanical system. In other embodiments, it will be appreciated that a transducer assembly can involve use of a Hall effect sensor in a head on configuration.

In the above examples, each Hall effect sensor can provide an output signal based upon movement of the magnetic field, resulting from relative movement between the magnet and the Hall effect sensor resulting from loading of the transducer assembly. The resulting output signal from the Hall effect sensor can be provided as a function of movement and corresponding load. For example, a transducer assembly can be configured such that a Hall effect sensor (e.g., each of 79 and 87) provides a 0-6 volt output signal in response to a 0-700 pound load. In one embodiment, the output signal can be linear over this range, though in another embodiment associated circuitry can be suitably calibrated to account for any nonlinearity of the output signal. In this example, in a linear configuration, if an output signal of 3 volts is provided by the Hall effect sensor, associated circuitry can determine that 350 pounds of load is measured by the Hall effect sensor. In such a configuration, the transducer assembly can be configured to provide an output signal that linearly corresponds to the amount of force transmitted through the transducer assembly, thereby facilitating ease of understanding and efficient integration of the transducer assembly into diagnostics systems. It will be appreciated that a specific Hall effect sensor and magnet combination can be selected for a transducer assembly based upon engineering considerations involving: the intended loading, characteristics and environment of the transducer assembly; the desired strength and shape of the magnetic field produced by the magnet; the range, sensitivity and output signal configurations of the Hall effect sensor; the total effective gap (e.g., longitudinal spacing) between the Hall effect sensor and the magnet; and the desired monitoring circuitry to be employed.

In one example, the transducer assembly, the leg 96 and the foot 90 can be provided as part of a leg assembly of a ladder, such as a stepladder or folding ladder, an extension ladder, or a platform ladder. In such a configuration, the transducer assembly can monitor the amount and direction of forces extending through the leg of the ladder. In one example, each leg of the ladder can be provided with such an arrangement in order that each such leg can be so monitored. A control unit can be coupled with wires or wirelessly to each of the transducer assemblies associated with the respective legs of the ladder. In one specific example, the foot 90 can be formed from plastic, such as through an injection molding process. Opposite the location of the attachment of the mounting plate 30 to the leg 96, a leg rail member (not shown) of a ladder can be received within and/or otherwise coupled with the leg 96. The leg rail member can be formed, for example, from an aluminum extrusion, steel, or fiberglass, for example. It will be appreciated that a leg (e.g., 96) can be provided in any of a variety of suitable configurations to facilitate its interface with different types of conventional leg rail members of ladders, thereby facilitating universal and efficient association of the present transducer assembly with a conventional leg rail member (without requiring re-design or re-engineering of the leg rail member itself). It will be appreciated, for example, that transducer assemblies as described herein can be used in association with and/or to implement the ladders, computing devices, and methods as described in U.S. patent application Ser. No. 16/763,076 which was published on Nov. 5, 2020 as U.S. Pat. App. Pub. No. 2020/0347674, the entire disclosure of which is hereby incorporated by reference herein in its entirety.

Figure 12:
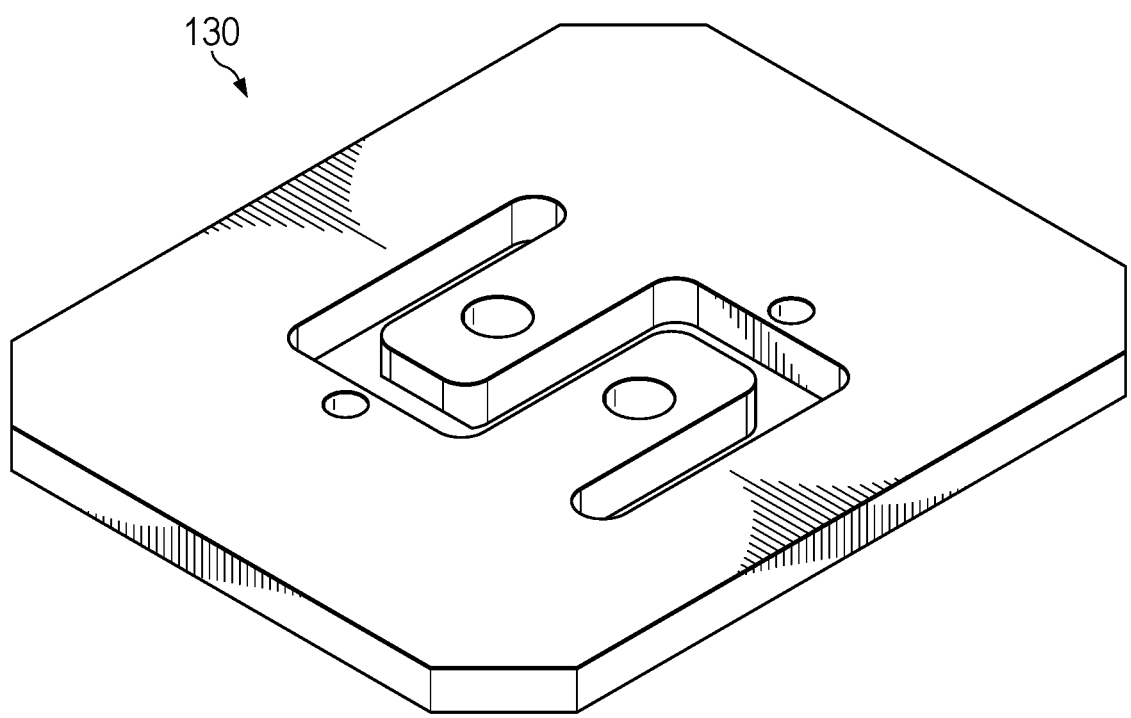
FIG. 12 is a bottom perspective view depicting a mounting plate of a transducer assembly in accordance with another embodiment.
Figure 13:
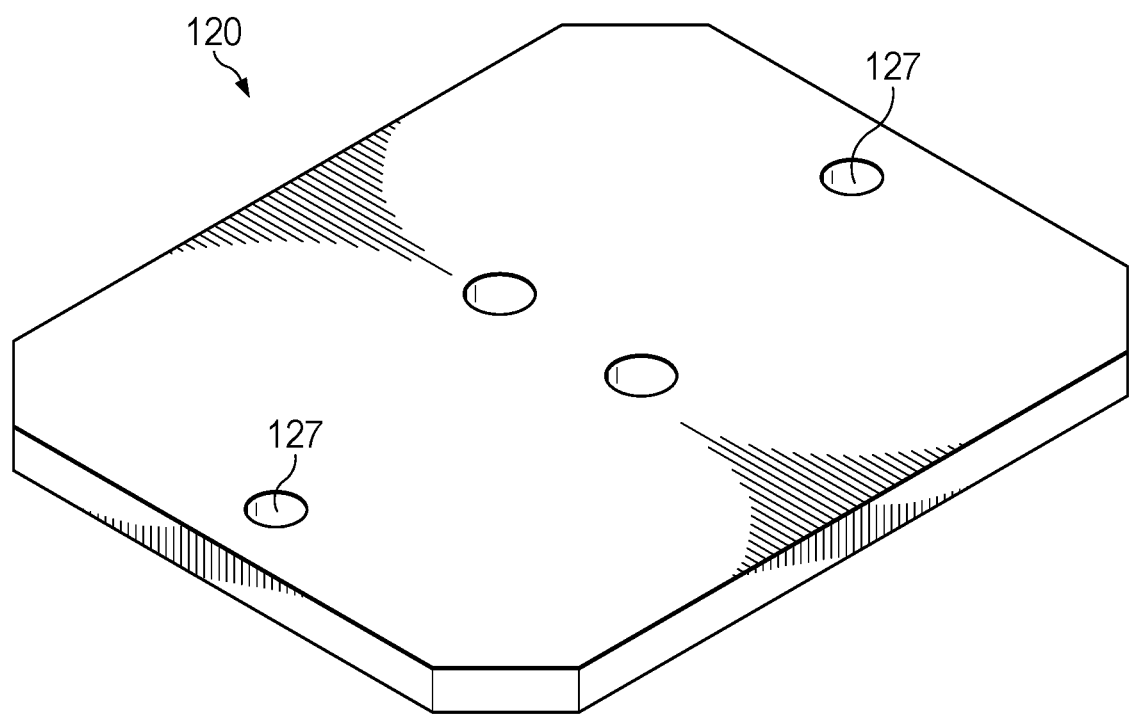
FIG. 13 is a bottom perspective view depicting an engagement plate of a transducer assembly in accordance with another embodiment.

In one example, a stepladder can include four transducer assemblies as described herein, wherein a respective one of which is associated with each of the four leg rail members of the stepladder. In one embodiment, the legs, feet and transducer assemblies can be identical for each of the four leg rail members. In such a configuration, each of the transducer assemblies can include two pairs of Hall effect sensors and magnets, thus resulting in the stepladder having a total of at least eight pairs of Hall effect sensors and magnets. Though in another embodiment, the legs, feet and transducer assemblies can be the same for two of the leg rail members of the stepladder (e.g., the front leg rail members), but different for the other two of the leg rail members of the stepladder (e.g., the rear leg rail members). In this latter configuration, the configuration of FIGS. 1-11 and 14 can be used with two of the leg rail members, wherein a different configuration can be used with the other two leg rail members. The different configuration can be generally the same as the configuration of FIGS. 1-11 and 14, except for example to account for variations in the dimension and/or configuration of the associated two leg rail members (e.g., the front leg rail members might have a different cross-sectional shape than the rear leg rail members, thus benefiting from use of different legs, feet and transducer assemblies. In particular, in the different configuration, in addition to there being differences in the legs to accommodate for differences in the leg rail members, mounting plates of the transducer assemblies can be varied in order to effectively engage the different legs, and/or engagement plates of the transducer assemblies can be varied in order to effectively engage the different feet. Examples of such a different mounting plate 130 and engagement plate 120 are shown in FIGS. 12-13, respectively. In the example of FIGS. 12-13, only two fasteners can be provided through respective apertures 127 in the engagement plate 120 to facilitate its attachment to a foot (not shown), and no apertures are shown to be provided in the mounting plate 130 as such can be attached to a leg or other structure without fasteners (e.g., with epoxy).

Figure 14:
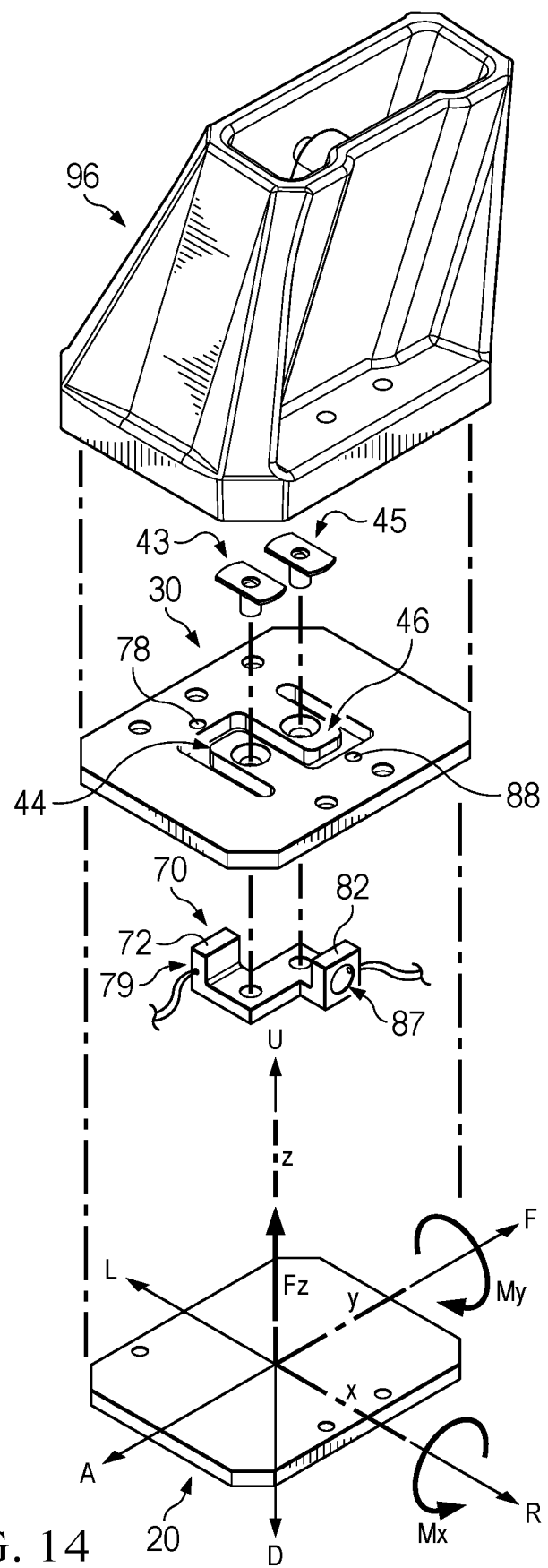
FIG. 14 is an exploded top perspective view depicting selected components of FIGS. 5-11.

Referring again to the transducer assembly of FIGS. 1-11 and 14, in one embodiment, the engagement plate 20, the support structure 70, the first finger region 44, and the second finger region 46 can be sufficiently joined in rigid association with one another such that, during loading of the transducer assembly through the engagement plate 20, the first end 81 does not move relative to the second end 83, and the first tab 72 does not move relative to the second tab 82. Therefore, as force is transmitted through the transducer assembly, regardless of the directional components of the force, both the first tab 72 and the second tab 82 can respond by moving together with one another relative to the perimeter region 40 of the mounting plate 30. In this way, the first tab 72 and the second tab 82 can be coherent with one another (i.e. joined in translational and rotational space). In such a configuration, the transducer assembly can facilitate simultaneous response/measurement from loading in multiple axes, such as for example combinations of vertical loads with moments applied about the fore/aft and lateral axes, with the vertical, fore/aft and lateral axes being orthogonal or normal relative one another (see FIG. 14). More particularly, with reference to FIG. 14, the transducer assembly can facilitate inherent measurement and decoupling between the desired vertical loads measurement (e.g., Fz) and any undesirable moments (e.g., Mx and My) about the lateral and fore-aft axes, respectively. The orthogonal axis xyz is shown in FIG. 14, along with a vertical force Fz being positive upward, a moment Mx about the lateral axis being positive CCW on the x-axis, and a moment My about the fore-aft axis being positive CCW on the y-axis. Also shown in FIG. 14, for clarity, are the vertical or z-axis (U=positive upward; D=negative downward), lateral or x-axis (R=positive rightward; L=negative leftward), and fore-aft or y-axis (F=positive forward; A=negative aft).

In such a configuration, as will be appreciated with reference to FIG. 14, when the loading applied to the engagement plate 20 is purely in the vertical/z-direction, both the first and second finger regions 44 and 46 can deflect upwardly in the same direction (from vertical bending), and corresponding first and second tabs 72 and 82 can deflect upwardly in the vertical direction relative to the magnets 78 and 88, respectively, which can result in transmission of positive signals from each of the Hall effect sensors 79 and 87. The magnitude of loading can be determined simply by adding together the forces corresponding to the signals received from each of the Hall effect sensors 79 and 87.

However, in such a configuration, as also will be appreciated with reference to FIG. 14, when the loading applied to the engagement plate 20 includes moments about the fore-aft and/or lateral axes, such as Mx and My, the associated deflections can be out-of-phase (of opposite sign) relative to one another, thus causing the sum of the resultant signals from the Hall effect sensors to be zero, in effect canceling out or decoupling the vertical response from the moments (Mx and My). For example, if My is applied through the engagement plate 20 (see FIG. 14), the first finger region 44 can deflect vertically upwardly and second finger region 46 can deflect vertically downwardly, with the corresponding first tab 72 deflecting vertically upwardly and the second tab 82 deflecting vertically downwardly relative to the respective magnets 78 and 88. This can result in the Hall effect sensor 79 generating a positive signal and the Hall effect sensor 87 generating a negative signal which, when added together, would sum to zero, thus canceling or decoupling the effect of the moment My. A similar out-of-phase cancelation can occur when Mx is applied to the engagement plate 20. In this case, the first finger region 44 can be deflected vertically downwardly and the second finger region 46 can be deflected vertically upwardly. The first tab 72 can accordingly be deflected vertically downwardly and the second tab 82 can be deflected vertically upwardly relative to the respective magnets 78 and 88. This can result in the Hall effect sensor 79 generating a negative signal and the Hall effect sensor 87 generating a positive signal which, when added together, would sum to zero, thus canceling or decoupling the effect of the moment Mx. Through measurements and calculations it will be appreciated that certain detected forces (e.g., moments about the lateral and fore-aft axis, or those not intended to be measured) can be out of phase with one another and thus eliminated through cancellation resulting from comparison (e.g., addition of one negative and one positive equals zero) of signals from respective Hall effect sensors of a transducer assembly, while other detected forces (e.g., vertical forces, or those intended to be measured) can be in phase with one another and amplified resulting from comparison (e.g., addition of two positive signals) of signals from respective Hall effect sensors of a transducer assembly.

Ladders tend to have a stance that results in the individual feet experiencing moments about both fore/aft and lateral axes. By rejecting/decoupling both moments and measuring only the vertical loading, an operational stage of the ladder can be determined. For example, in one embodiment, a respective transducer assembly as described herein can be associated with each of the four legs of a stepladder, and each of the four transducer assemblies can be coupled with a control unit. Depending upon the magnitude of vertical loading measured on each of the four legs of the stepladder, the control unit can determine a present operating state of the stepladder. More particularly, with the weight of the user and associated total downward force being generally consistent regardless of a user's position on the stepladder, through comparison of signals from the Hall effect sensors, the control unit can identify a precise location of the user relative to the stepladder such as, for example, if a user is present upon the stepladder, which step of the stepladder the person is standing upon, if the person is improperly climbing the back of the stepladder, or if a person is leaning left or right while on the stepladder. In one embodiment, to facilitate this determination, the control unit conducts mathematical calculations based upon the feedback received from each of the Hall effect sensors (e.g., eight of them, with two at each of the four legs of the stepladder), to result in a total or composite identification of the user's position relative to the ladder.

The small size of a transducer assembly as described herein facilitates its effective embedment in a foot of a ladder or other equipment, without impacting desired or normal operation of the ladder or other equipment. It will be appreciated that a transducer assembly as disclosed herein can be advantageously implemented in any of a variety of other suitable force measurement applications, such as by provision directly in a load path. For example, it will be appreciated that a transducer assembly might instead be configured for attachment to an arm, a plate, a buttress or another type of rigid or flexible force transmission apparatus. As such, the transducer assembly can be associated with any of a variety of other types of equipment in which monitoring of forces is desired. For example, it will be appreciated that transducer assemblies as described herein can be used in any of a variety of applications other than ladders. Examples of such equipment can include scaffolds, structural supports of buildings, vehicles, or machinery, sporting equipment, and consumer products. For example, the transducer assembly can be employed to facilitate monitoring of a scaffold such as described in U.S. Pat. App. Ser. No. 63/388,666 which was filed Jul. 13, 2022, the entire disclosure of which is hereby incorporated by reference herein in its entirety. Additionally, the transducer assembly can be employed to facilitate monitoring of any of a variety of other components of a worksite and/or safety ecosystem such as those described in U.S. Pat. App. Ser. No. 63/391,339 which was filed Jul. 22, 2022, the entire disclosure of which is hereby incorporated by reference herein in its entirety. It will be appreciated that the transducer assembly as described herein can be provided as a factory-installed component of a piece of equipment such as a ladder or scaffold for example, or instead can be provided as an aftermarket accessory capable of easily and inexpensively fitting onto an existing piece of equipment.

It will be appreciated, upon review of the various embodiments illustrated and described, that a transducer assembly in accordance with the present disclosure can be provided in any of a variety of suitable alternative configurations, yet still being within the scope of the disclosure provided herein. It will further be appreciated that a transducer assembly can instead be configured as an S-type, hinge or other configuration which is shown and described in U.S. provisional patent application Ser. No. 63/334,736 filed Apr. 26, 2022, which has been incorporated by reference herein in its entirety.

The foregoing description of embodiments and examples of the disclosure has been presented for purposes of illustration and description. It is not intended to be exhaustive or to limit the disclosure to the forms described. Numerous modifications are possible in light of the above teachings. Some of those modifications have been discussed and others will be understood by those skilled in the art. The embodiments were chosen and described in order to best illustrate the principles of the disclosure and various embodiments as are suited to the particular use contemplated. The scope of the disclosure is, of course, not limited to the examples or embodiments set forth herein, but can be employed in any number of applications and equivalent devices by those of ordinary skill in the art. Rather it is hereby intended the scope of the invention be defined by the claims appended hereto. Also, for any methods claimed and/or described, regardless of whether the method is described in conjunction with a flow diagram, it should be understood that unless otherwise specified or required by context, any explicit or implicit ordering of steps performed in the execution of a method does not imply that those steps must be performed in the order presented and may be performed in a different order or in parallel.

What is claimed is:

1. A transducer assembly comprising:
    an engagement plate comprising a first lower surface and a first upper surface, the first lower surface being opposite the first upper surface;
    a mounting plate comprising a second lower surface and a second upper surface, the second lower surface being opposite the second upper surface, the mounting plate comprising a perimeter region and an inner region, the perimeter region circumscribing the inner region, the mounting plate defining an S-shaped cutout extending through the mounting plate from the second lower surface to the second upper surface to define a first finger region of the inner region and a second finger region of the inner region, wherein:
        the first finger region extends from a first proximal end to a first distal end, the first proximal end is coupled with the perimeter region, and the first distal end is spaced from the perimeter region by a first gap defined by the S-shaped cutout;
        the second finger region extends from a second proximal end to a second distal end, the second proximal end is coupled with the perimeter region, and the second distal end is spaced from the perimeter region by a second gap defined by the S-shaped cutout;
        the perimeter region defines a first aperture adjacent to the first gap; and
        the perimeter region defines a second aperture adjacent to the second gap;
    a support structure comprising:
        a base extending longitudinally from a first end to a second end, the base comprising a third lower surface and a third upper surface, the third lower surface being opposite the third upper surface, the third upper surface being adjacent to portions of the second lower surface corresponding with each of the first finger region and the second finger region, the third lower surface being adjacent to the first upper surface;
        a first tab extending perpendicularly from the first end of the base and into the first gap, wherein the first tab defines a first receptacle; and
        a second tab extending perpendicularly from the second end of the base and into the second gap, wherein the second tab defines a second receptacle;
    a first sensor assembly comprising a first magnet and a first Hall effect sensor in magnetic proximity to one another, one of the first magnet and the first Hall effect sensor is at least partially disposed and fixedly coupled within the first aperture, and the other of the first magnet and the first Hall effect sensor is at least partially disposed and fixedly coupled within the first receptacle; and
    a second sensor assembly comprising a second magnet and a second Hall effect sensor in magnetic proximity to one another, one of the second magnet and the second Hall effect sensor is at least partially disposed and fixedly coupled within the second aperture, and the other of the second magnet and the second Hall effect sensor is at least partially disposed and fixedly coupled within the second receptacle.

2. The transducer assembly of claim 1 wherein:
    the first magnet is at least partially disposed and fixedly coupled within the first aperture;
    the first Hall effect sensor is at least partially disposed and fixedly coupled within the first receptacle;
    the second magnet is at least partially disposed and fixedly coupled within the second aperture; and
    the second Hall effect sensor is at least partially disposed and fixedly coupled within the second receptacle.

3. The transducer assembly of claim 2 wherein, in response to force transmitted between the first lower surface and the second upper surface:
    the first magnet is configured to slide by the first Hall effect sensor; and
    the second magnet is configured to slide by the second Hall effect sensor.

4. The transducer assembly of claim 2 further comprising:
    a first circuit board;
    a first capacitor;
    a second circuit board; and
    a second capacitor; wherein
    the first Hall effect sensor and the first capacitor are mounted to the first circuit board;
    the second Hall effect sensor and the second capacitor are mounted to the second circuit board;
    the first circuit board is at least partially disposed and fixedly coupled within the first receptacle; and
    the second circuit board is at least partially disposed and fixedly coupled within the second receptacle.

5. The transducer assembly of claim 1 wherein:
    the third upper surface contacts portions of the second lower surface corresponding with each of the first finger region and the second finger region; and
    the third lower surface contacts the first upper surface.

6. The transducer assembly of claim 5 wherein no portion of the perimeter region overlies the base of the support structure.

7. The transducer assembly of claim 1 wherein no portion of the perimeter region overlies the base of the support structure.

8. The transducer assembly of claim 1 wherein:
    the engagement plate defines a first outer perimeter;
    the perimeter region of the mounting plate defines a second outer perimeter; and
    the first outer perimeter generally corresponds in shape and size with the second outer perimeter.

9. The transducer assembly of claim 1 wherein:
    the engagement plate is formed from a first piece of metal plate;
    the mounting plate is formed from a second piece of metal plate;
    the support structure is formed as a unitary structure.

10. The transducer assembly of claim 9 wherein:
    the first piece of metal plate has been stamped;
    the second piece of metal plate has been stamped;
    the support structure has been 3D printed.

11. The transducer assembly of claim 1 wherein the engagement plate defines a plurality of engagement plate interface apertures each extending through the engagement plate from the first lower surface to the first upper surface.

12. The transducer assembly of claim 1 wherein the perimeter region of the mounting plate defines a plurality of mounting plate interface apertures each extending through the mounting plate from the second lower surface to the second upper surface.

13. The transducer assembly of claim 1 further comprising a first fastener and a second fastener, wherein:
   the engagement plate defines a first engagement plate alignment aperture and a second engagement plate alignment aperture each extending through the engagement plate from the first lower surface to the first upper surface;
   the first finger region defines a first mounting plate alignment aperture extending through the first finger region from the second lower surface to the second upper surface;
   the second finger region defines a second mounting plate alignment aperture extending through the second finger region from the second lower surface to the second upper surface;
   the base defines a first base alignment aperture and a second base alignment aperture each extending through the base from the third lower surface to the third upper surface;
   the first fastener extends through each of the first engagement plate alignment aperture, the first base alignment aperture, and the first mounting plate alignment aperture; and
   the second fastener extends through each of the second engagement plate alignment aperture, the second base alignment aperture, and the second mounting plate alignment aperture.

14. A piece of equipment comprising the transducer assembly of claim 1, the piece of equipment further comprising a foot and a leg, wherein:
   the foot is coupled with the engagement plate;
   the leg is coupled with the mounting plate; and
   the transducer assembly is configured to provide a load path from the leg to the foot.

15. The piece of equipment of claim 14, further comprising a plurality of first interface fasteners and a plurality of second interface fasteners, wherein:
   the engagement plate defines a plurality of engagement plate interface apertures each extending through the engagement plate from the first lower surface to the first upper surface;
   the perimeter region of the mounting plate defines a plurality of mounting plate interface apertures each extending through the mounting plate from the second lower surface to the second upper surface;
   each of the first interface fasteners extends through the foot and into a respective one of the engagement plate interface apertures; and
   each of the second interface fasteners extends through a respective one of the mounting plate interface apertures and into the leg.

16. The piece of equipment of claim 14, wherein:
   the first magnet is at least partially disposed and fixedly coupled within the first aperture;
   the first Hall effect sensor is at least partially disposed and fixedly coupled within the first receptacle;
   the second magnet is at least partially disposed and fixedly coupled within the second aperture;
   the second Hall effect sensor is at least partially disposed and fixedly coupled within the second receptacle; and
   in response to force transmitted between the first lower surface and the second upper surface:
      the first magnet is configured to slide by the first Hall effect sensor; and
      the second magnet is configured to slide by the second Hall effect sensor.

17. The piece of equipment of claim 14, wherein:
   the transducer assembly further comprises a first fastener and a second fastener;
   the engagement plate defines a first engagement plate alignment aperture and a second engagement plate alignment aperture each extending through the engagement plate from the first lower surface to the first upper surface;
   the first finger region defines a first mounting plate alignment aperture extending through the first finger region from the second lower surface to the second upper surface;
   the second finger region defines a second mounting plate alignment aperture extending through the second finger region from the second lower surface to the second upper surface;
   the base defines a first base alignment aperture and a second base alignment aperture each extending through the base from the third lower surface to the third upper surface;
   the first fastener extends through each of the first engagement plate alignment aperture, the first base alignment aperture, and the first mounting plate alignment aperture; and
   the second fastener extends through each of the second engagement plate alignment aperture, the second base alignment aperture, and the second mounting plate alignment aperture.

18. The piece of equipment of claim 14, wherein the foot is configured for resting upon a ground surface and transmitting load from the leg to the ground surface.

19. A transducer assembly comprising:
   an engagement plate;
   a mounting plate defining an S-shaped cutout extending through the mounting plate to define a first finger region, a second finger region and a perimeter region, wherein:
      the first finger region comprises a first distal end spaced from the perimeter region by a first gap defined by the S-shaped cutout;
      the second finger region comprises a second distal end spaced from the perimeter region by a second gap defined by the S-shaped cutout;
   a support structure comprising:
      a base sandwiched between the engagement plate and the mounting plate;
      a first tab extending from the base and into the first gap; and
      a second tab extending from the base and into the second gap;
   a first sensor assembly comprising a first magnet and a first Hall effect sensor in magnetic proximity to one another, one of the first magnet and the first Hall effect sensor is fixedly coupled with the first tab, and the other of the first magnet and the first Hall effect sensor is fixedly coupled relative to the perimeter region of the mounting plate; and
   a second sensor assembly comprising a second magnet and a second Hall effect sensor in magnetic proximity to one another, one of the second magnet and the second Hall effect sensor is fixedly coupled with the second tab, and the other of the second magnet and the second Hall effect sensor is fixedly coupled relative to the perimeter region of the mounting plate.

20. The transducer assembly of claim 19 wherein:
the perimeter region defines a first aperture adjacent to the first gap;
the perimeter region defines a second aperture adjacent to the second gap;
the first tab defines a first receptacle;
the second tab defines a second receptacle;
the first magnet is at least partially disposed and fixedly coupled within the first aperture;
the first Hall effect sensor is at least partially disposed and fixedly coupled within the first receptacle;
the second magnet is at least partially disposed and fixedly coupled within the second aperture;
the second Hall effect sensor is at least partially disposed and fixedly coupled within the second receptacle; and
in response to force transmitted between the first lower surface and the second upper surface:
 the first magnet is configured to slide by the first Hall effect sensor; and
 the second magnet is configured to slide by the second Hall effect sensor.

21. The transducer assembly of claim 19 wherein:
the base contacts each of the engagement plate, the first finger region and the second finger region; and
no portion of the perimeter region overlies the base of the support structure.

22. The transducer assembly of claim 19 further comprising a first fastener and a second fastener, wherein:
the engagement plate defines a first engagement plate alignment aperture and a second engagement plate alignment aperture;
the first finger region defines a first mounting plate alignment aperture;
the second finger region defines a second mounting plate alignment aperture;
the base defines a first base alignment aperture and a second base alignment aperture;
the first fastener extends through each of the first engagement plate alignment aperture, the first base alignment aperture, and the first mounting plate alignment aperture; and
the second fastener extends through each of the second engagement plate alignment aperture, the second base alignment aperture, and the second mounting plate alignment aperture.

23. A piece of equipment comprising the transducer assembly of claim 19, the piece of equipment further comprising a foot and a leg, wherein:
the foot is coupled with the engagement plate;
the leg is coupled with the mounting plate; and
the transducer assembly is configured to provide a load path from the leg to the foot;
wherein the foot is configured for resting upon a ground surface and transmitting load from the leg to the ground surface.

24. The piece of equipment of claim 23, further comprising a plurality of first interface fasteners and a plurality of second interface fasteners, wherein:
the perimeter region of the mounting plate defines a plurality of mounting plate interface apertures; and
each of the second interface fasteners extends through a respective one of the mounting plate interface apertures and into the leg.

* * * * *